(12) United States Patent
Yamazaki et al.

(10) Patent No.: US 12,058,913 B2
(45) Date of Patent: Aug. 6, 2024

(54) DISPLAY PANEL AND INFORMATION PROCESSING DEVICE

(71) Applicant: SEMICONDUCTOR ENERGY LABORATORY CO., LTD., Atsugi (JP)

(72) Inventors: Shunpei Yamazaki, Tokyo (JP); Harue Osaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 284 days.

(21) Appl. No.: 17/425,786

(22) PCT Filed: Feb. 12, 2020

(86) PCT No.: PCT/IB2020/051104
§ 371 (c)(1),
(2) Date: Jul. 26, 2021

(87) PCT Pub. No.: WO2020/174301
PCT Pub. Date: Sep. 3, 2020

(65) Prior Publication Data
US 2022/0123054 A1     Apr. 21, 2022

(30) Foreign Application Priority Data

Feb. 26, 2019 (JP) ................. 2019-032753

(51) Int. Cl.
*H10K 59/38* (2023.01)
*H10K 59/12* (2023.01)
*H10K 101/30* (2023.01)

(52) U.S. Cl.
CPC ............ *H10K 59/38* (2023.02); *H10K 59/12* (2023.02); *H10K 2101/30* (2023.02)

(58) Field of Classification Search
CPC .... H10K 59/38; H10K 59/12; H10K 2101/30; H10K 2101/40; H10K 50/11;
(Continued)

(56) References Cited

U.S. PATENT DOCUMENTS 8,593,590 B2    11/2013  Jung
8,841,655 B2     9/2014  Okamoto
(Continued)

FOREIGN PATENT DOCUMENTS

CN    001685770 A    10/2005
CN    104488105 A     4/2015
(Continued)

OTHER PUBLICATIONS

Aonuma.M et al., "Material design of hole transport materials capable of thick-film formation in organic light emitting diodes", Appl. Phys. Lett. (Applied Physics Letters), Apr. 30, 2007, vol. 90, pp. 183503-1-183503-3.
(Continued)

*Primary Examiner* — Yasser A Abdelaziez
(74) *Attorney, Agent, or Firm* — Fish & Richardson P.C.

(57) ABSTRACT

A display panel is provided. The display panel includes a display region, an insulating film, and a sealing film; the display region includes a pixel; and the pixel includes a display element and a color conversion layer. The insulating film covers the display element, the sealing film includes a region, the color conversion layer is sandwiched between the region and the insulating film, and the sealing film includes a region that is on the outside of the display region and in contact with the insulating film. The display element includes a first layer, a second layer, a third layer, and a fourth layer. The first layer contains a first material and a second material, the second layer contains a third material, the third layer contains a light-emitting material and a fourth
(Continued)

material, the fourth layer contains a fifth material and a sixth material, the first material has a HOMO level higher than or equal to −5.7 eV and lower than or equal to −5.4 eV, the second material has an acceptor property, the third material has a lower HOMO level than the first material, the fifth material has a HOMO level higher than or equal to −6.0 eV, and the sixth material is an organic complex of alkali metal or an organic complex of alkaline earth metal.

8 Claims, 15 Drawing Sheets

(58) Field of Classification Search
CPC .. H10K 50/155; H10K 50/165; H10K 50/844; H10K 30/865; H10K 50/125; G09F 9/30; H05B 33/04; H05B 33/12; H05B 33/22; G02B 5/201; G02B 5/206; G06F 1/1605
See application file for complete search history.

(56) References Cited

U.S. PATENT DOCUMENTS

| | | | |
|---|---|---|---|
| 10,411,193 | B2 | 9/2019 | Kawakami et al. |
| 10,930,855 | B2 | 2/2021 | Takita et al. |
| 2006/0152150 | A1 | 7/2006 | Boerner et al. |
| 2011/0127510 | A1 | 6/2011 | Seo et al. |
| 2015/0349285 | A1* | 12/2015 | Seo ............... H10K 50/11 257/40 |
| 2016/0248033 | A1 | 8/2016 | Uesaka et al. |
| 2017/0062734 | A1 | 3/2017 | Suzuki et al. |
| 2018/0033993 | A1 | 2/2018 | Seo et al. |
| 2018/0114916 | A1 | 4/2018 | Hayashi et al. |
| 2019/0363259 | A1 | 11/2019 | Kawakami et al. |
| 2020/0388790 | A1* | 12/2020 | Yamazaki ............. G06F 3/041 |

FOREIGN PATENT DOCUMENTS

| | | |
|---|---|---|
| EP | 2879196 A | 6/2015 |
| JP | 2006-501617 | 1/2006 |
| JP | 2012-059962 A | 3/2012 |
| JP | 2012-248405 A | 12/2012 |
| KR | 2005-0072424 A | 7/2005 |
| KR | 2012-0092888 A | 8/2012 |
| KR | 2015-0039131 A | 4/2015 |
| KR | 2018-0095872 A | 8/2018 |
| TW | 201412712 | 4/2014 |
| WO | WO-2004/032576 | 4/2004 |
| WO | WO-2010/110034 | 9/2010 |
| WO | WO-2011/065136 | 6/2011 |
| WO | WO-2012/032913 | 3/2012 |
| WO | WO-2012/111893 | 8/2012 |
| WO | WO-2014/017484 | 1/2014 |
| WO | WO-2015/147073 | 10/2015 |

OTHER PUBLICATIONS

Kwak.K et al., "Analysis of thermal degradation of organic light-emitting diodes with infrared imaging and impedance spectroscopy", Optics Express, Nov. 21, 2013, vol. 21, No. 24, pp. 29558-29566.

International Search Report (Application No. PCT/IB2020/051104) Dated Jun. 9, 2020.

Written Opinion (Application No. PCT/IB2020/051104) Dated Jun. 9, 2020.

Okachi.T et al., "Determination of Charge-Carrier Mobility in Organic Light-Emitting Diodes by Impedance Spectroscopy in Presence of Localized States", Jpn. J. Appl. Phys. (Japanese Journal of Applied Physics), Dec. 19, 2008, vol. 47, No. 12, pp. 8965-8972.

* cited by examiner

DISPLAY PANEL AND INFORMATION PROCESSING DEVICE

CROSS REFERENCE TO RELATED APPLICATIONS

This application is a U.S. National Phase Application under 35 U.S.C. § 371 of International Application PCT/IB2020/051104, filed on Feb. 12, 2020, which is incorporated by reference and claims the benefit of a foreign priority application filed in Japan on Feb. 26, 2019, as Application No. 2019-032753.

TECHNICAL FIELD

One embodiment of the present invention relates to a display panel, an information processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

Light-emitting devices (organic EL elements) including organic compounds and utilizing electroluminescence (EL) have been put into practical use. In the basic structure of such light-emitting devices, an organic compound layer containing a light-emitting substance (an EL layer) is sandwiched between a pair of electrodes. Carriers are injected by application of voltage to the element, and recombination energy of the carriers is used, whereby light emission can be obtained from the light-emitting substance.

Such light-emitting devices are of self-light-emitting type and thus have advantages over liquid crystal displays, such as high visibility and no need for backlight when used as pixels of a display, and are suitable as flat panel display devices. Displays including such light-emitting devices are also highly advantageous in that they can be thin and lightweight. Moreover, an extremely fast response speed is also a feature.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting apparatuses and the like.

Displays or lighting apparatuses using light-emitting devices can be suitably used for a variety of electronic devices as described above, and research and development of light-emitting devices have progressed for higher efficiency and longer lifetime.

Patent Document 1 discloses a structure in which a hole-transport material, which has a HOMO (Highest Occupied Molecular Orbital) level between the HOMO level of a first hole-injection layer and the HOMO level of a host material, is provided between a light-emitting layer and a first hole-transport layer in contact with the hole-injection layer.

The characteristics of light-emitting devices have been improved considerably, but are still insufficient to satisfy advanced requirements for various characteristics such as efficiency and durability.

REFERENCE

Patent Document

[Patent Document 1] PCT International Publication No. WO2011/065136

SUMMARY OF THE INVENTION

Problems to be Solved by the Invention

An object of one embodiment of the present invention is to provide a novel display panel that is highly convenient or reliable. Another object is to provide a novel information processing device that is highly convenient or reliable. Another object is to provide a novel display panel, a novel information processing device, or a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems (1) One embodiment of the present invention is a display panel including a display region, an insulating film, and a sealing film.

The display region includes a first pixel, and the first pixel includes a first display element and a first color conversion layer.

The first color conversion layer includes a region overlapping with the first display element, the first color conversion layer converts first light into second light, and the second light includes a spectrum including a high proportion of light with a long wavelength compared with the first light.

An insulating film 573 covers the first display element, the sealing film includes a region, the first color conversion layer is sandwiched between the region and the insulating film, and the sealing film includes a region that is on an outside of the display region and in contact with the insulating film.

The first display element emits the first light, and the first display element includes a first layer, a second layer, a third layer, and a fourth layer, The third layer is sandwiched between the second layer and the fourth layer, and the second layer is sandwiched between the first layer and the third layer.

The first layer contains a first material and a second material, the second layer contains a third material, and the third layer contains a light-emitting material and a fourth material. The fourth layer contains a fifth material and a sixth material.

The first material has a HOMO level higher than or equal to $-5.7$ eV and lower than or equal to $-5.4$ eV, and the second material has an acceptor property.

the third material has a lower HOMO level than the first material, and the fourth material has a lower HOMO level than the third material.

The fifth material has a HOMO level higher than or equal to −6.0 eV, and the sixth material is an organic complex of alkali metal or an organic complex of alkaline earth metal.

(2) Another embodiment of the present invention is the above display panel in which the fifth material has an electron mobility higher than or equal to $1\times10^{-7}$ cm$^2$/Vs and lower than or equal to $5\times10^{-5}$ cm$^2$/Vs when the square root of the electric field strength [V/cm] is 600.

Thus, a decrease in display quality that would occur after the start of use can be inhibited. Alternatively, a decrease in color reproducibility that would occur after the start of use can be inhibited. Alternatively, a decrease in luminance that would occur after the start of use can be inhibited. Alternatively, entry of impurities that would degrade characteristics can be inhibited. Alternatively, a bright color can be displayed. Alternatively, productivity is high. As a result, a novel display panel that is highly convenient or reliable can be provided.

(3) Another embodiment of the present invention is the above display panel in which the first color conversion layer includes a quantum dot and a light-transmitting resin.

Thus, the spectral width of second light h2 can be narrowed. Alternatively, light with a narrow half width of a spectrum can be used. Alternatively, a color with high saturation can be displayed. Alternatively, aggregation of quantum dots can be prevented. As a result, a novel display panel that is highly convenient or reliable can be provided.

(4) Another embodiment of the present invention is the above display panel in which the first light is blue light.

Thus, blue light can be converted into green light. Alternatively, blue light can be converted into red light. Alternatively, blue light can be converted into light with a longer wavelength. As a result, a novel display panel that is highly convenient or reliable can be provided.

(5) Another embodiment of the present invention is the above display panel in which the first display element includes a first light-emitting unit, a second light-emitting unit, and an intermediate layer.

The intermediate layer includes a region sandwiched between the first light-emitting unit and the second light-emitting unit and has a function of supplying a hole to one of the first light-emitting unit and the second light-emitting unit and supplying an electron to the other of the first light-emitting unit and the second light-emitting unit.

The first light-emitting unit emits blue light, and the second light-emitting unit also emits blue light.

Accordingly, the current efficiency of light emission can be increased. Alternatively, power consumption can be reduced. As a result, a novel display panel that is highly convenient or reliable can be provided.

(6) Another embodiment of the present invention is the above display panel including a functional layer 520.

The functional layer includes a region overlapping with the display element, the functional layer includes a first pixel circuit, and the functional layer includes an opening portion The first pixel includes the first pixel circuit, and the first pixel circuit is electrically connected to the first display element in the opening portion.

Thus, the operation of the display element can be controlled. As a result, a novel display panel that is highly convenient or reliable can be provided.

(7) Another embodiment of the present invention is the above display panel in which the display region 231 includes a second pixel and a third pixel.

The first pixel displays red.

The second pixel displays green, and the second pixel includes a second color conversion layer.

The third pixel displays blue.

The first color conversion layer converts blue light into red light, and the second color conversion layer converts blue light into green light.

Thus, a full-color image can be displayed. Alternatively, the degree of decrease in the luminance of the display element, which would occur after the start of use, can be substantially the same among a plurality of pixels that display different colors. Alternatively, the degree of deterioration of the display elements, which is caused by the use, can be substantially the same among the plurality of pixels. Alternatively, a decrease in color reproducibility that would occur after the start of use can be inhibited. As a result, a novel display panel that is highly convenient or reliable can be provided.

(8) Another embodiment of the present invention is an information processing device including one or more of a keyboard, a hardware button, a pointing device, a touch sensor, an illuminance sensor, an imaging device, an audio input device, an eye-gaze input device, and an attitude detection device, and the above display panel.

Although a block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the source and the drain interchange with each other according to the above relation of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient or reliable can be provided. Alternatively, a novel information processing device that is highly convenient or reliable can be provided. Alternatively, a novel display panel, a novel information processing device, or a novel semiconductor device can be provided.

Note that the description of these effects does not preclude the existence of other effects. One embodiment of the present invention does not have to have all of these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
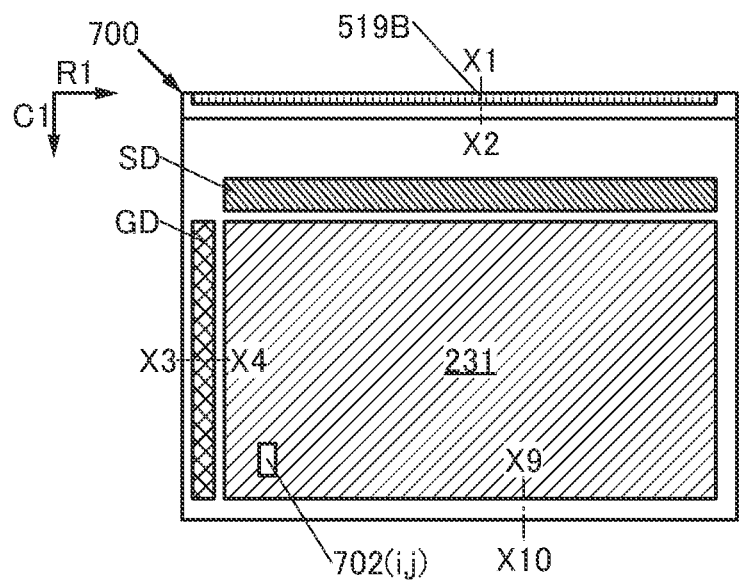
FIG. 1A to FIG. 1C are diagrams illustrating a structure of a display panel of an embodiment.

A display panel of one embodiment of the present invention includes a display region, an insulating film, and a sealing film. The display region includes a pixel, the pixel includes a display element and a color conversion layer, the color conversion layer includes a region overlapping with the display element, and the color conversion layer converts first light into second light. The second light has a spectrum including a high proportion of light with a long wavelength compared with the first light h1. The insulating film covers the display element, the sealing film includes a region, the color conversion layer is sandwiched between the region and the insulating film, and the sealing film includes a region that is on the outside of the display region and in contact with the insulating film. The display element emits the first light, the display element includes a first layer, a second layer, a third layer, and a fourth layer, the third layer is sandwiched between the first layer and the fourth layer, and the second layer is sandwiched between the first layer and the third layer. The first layer contains a first material and a second material, the second layer contains a third material, the third layer contains a light-emitting material and a fourth material, the fourth layer contains a fifth material and a sixth material, the first material has a HOMO level higher than or equal to −5.7 eV and lower than or equal to −5.4 eV, the second material has an acceptor property, the third material has a lower HOMO level than the first material, the fourth material HOST has a lower HOMO level than the third material, and the sixth material is an organic complex of alkali metal or an organic complex of alkaline earth metal.

Thus, a decrease in display quality that would occur after the start of use can be inhibited. Alternatively, a decrease in color reproducibility that would occur after the start of use can be inhibited. Alternatively, a decrease in luminance that would occur after the start of use can be inhibited. Alternatively, entry of impurities that would degrade characteristics can be inhibited. Alternatively, a bright color can be displayed. Alternatively, productivity is high. As a result, a novel display panel that is highly convenient or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a display panel of one embodiment of the present invention will be described with reference to FIG. 1 to FIG. 5.

Figure 1B:
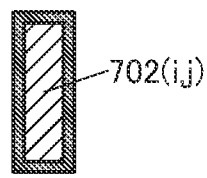
Figure 1C:
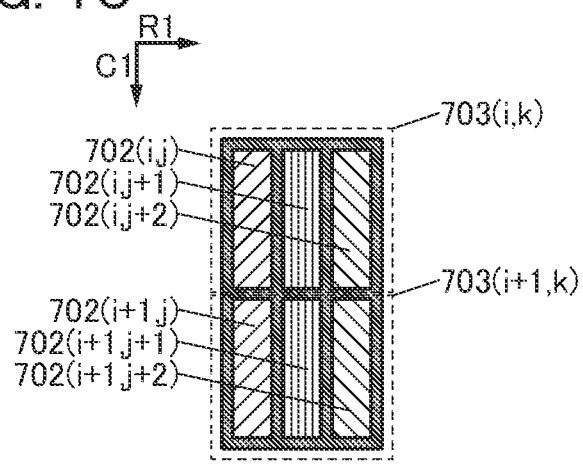

FIG. 1 illustrates a structure of a display panel of one embodiment of the present invention. FIG. 1A is a top view of the display panel of one embodiment of the present invention, and FIG. 1B and FIG. 1C are top views illustrating part of FIG. 1A.

Figure 2A:
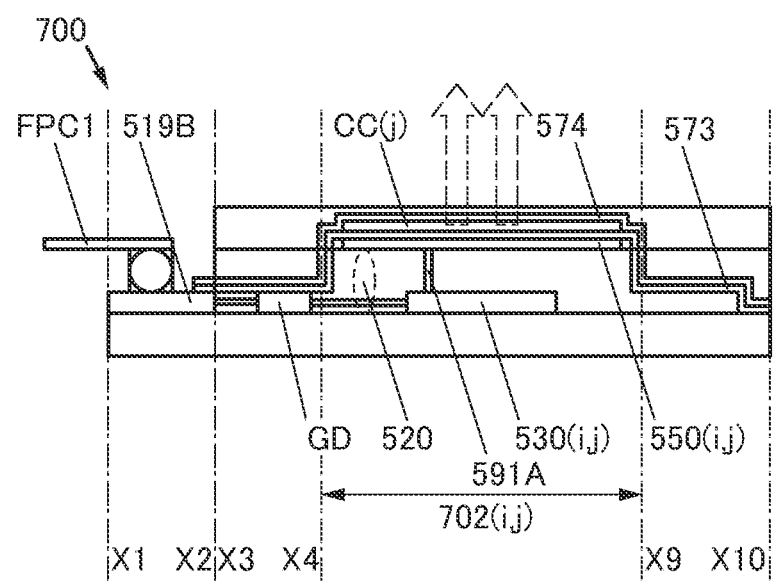
FIGS. 2A and 2B are diagrams illustrating a structure of a display panel of an embodiment.
Figure 2B:
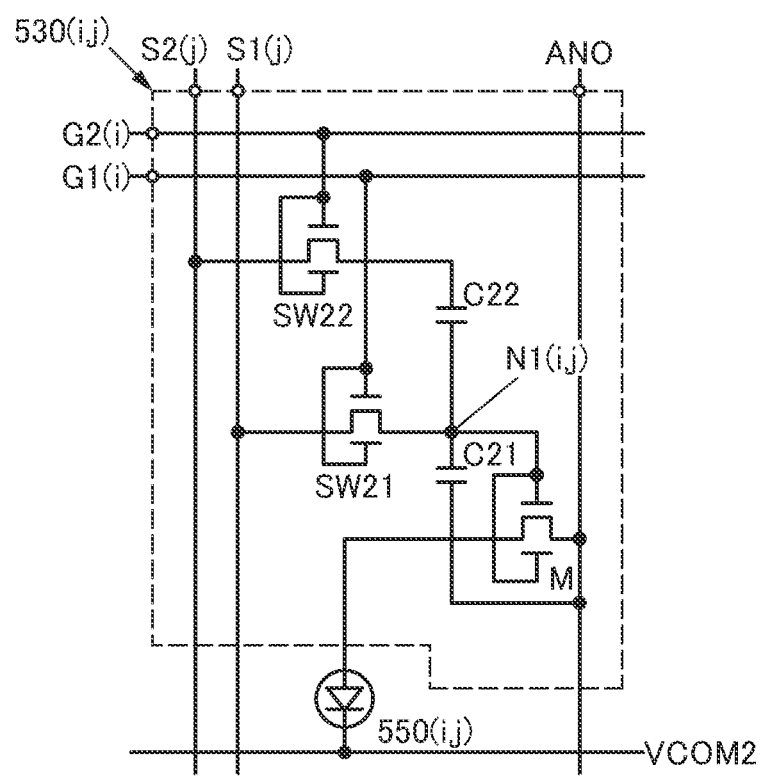

FIG. 2 illustrates a structure of the display panel of one embodiment of the present invention. FIG. 2A is a cross-sectional view taken along a cutting line X1-X2, a cutting line X3-X4, and a cutting line X9-X10 and of a pixel in FIG. 1A, and FIG. 2B is a circuit diagram illustrating a structure of a pixel circuit 530(i,j).

Figure 3A:
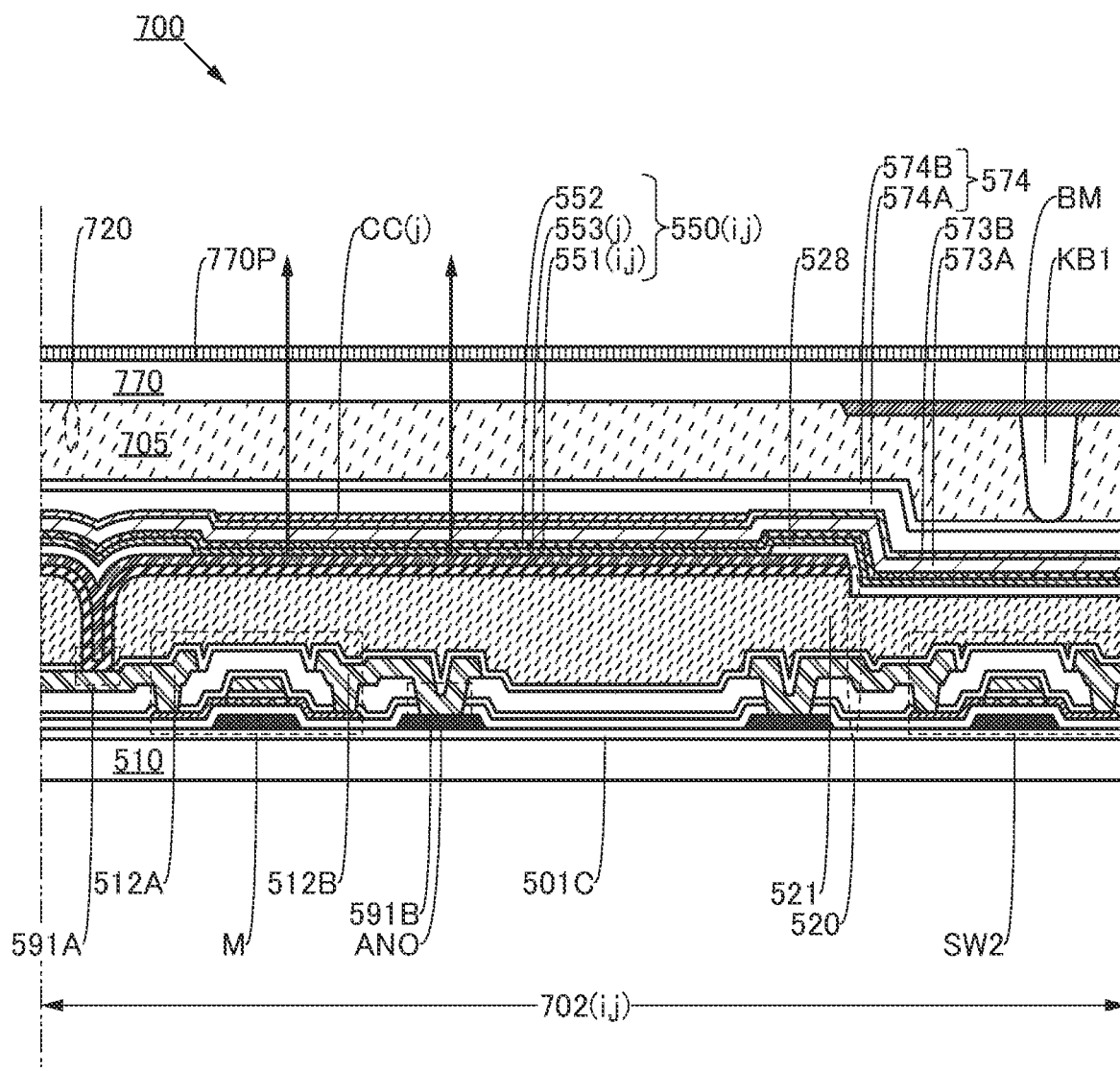
FIG. 3A and FIG. 3B are diagrams illustrating a structure of a display panel of an embodiment.
Figure 3B:
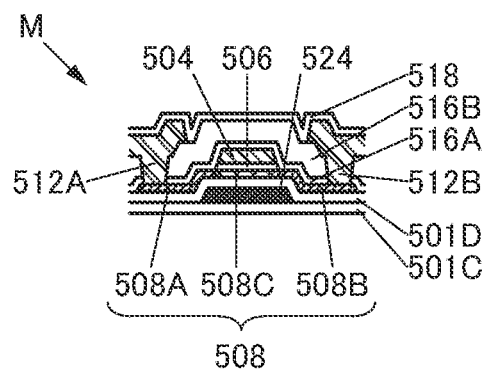

FIG. 3 illustrates a structure of the display panel of one embodiment of the present invention. FIG. 3A is a cross-sectional view of a pixel 702(i,j) in FIG. 1A, and FIG. 3B is a cross-sectional view illustrating part of FIG. 3A.

Figure 4A:
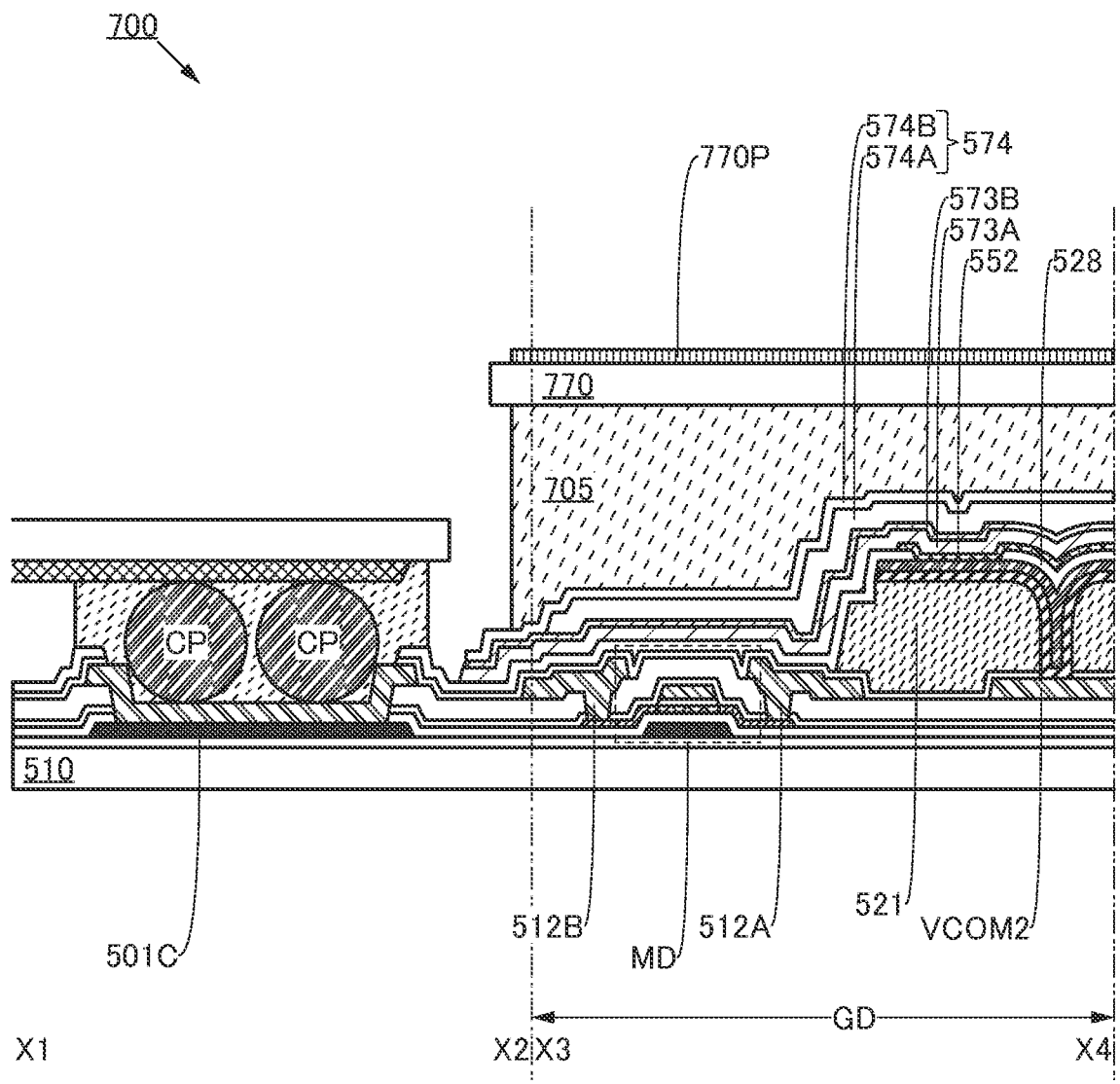
FIG. 4A and FIG. 4B are diagrams illustrating a structure of a display panel of an embodiment.
Figure 4B:
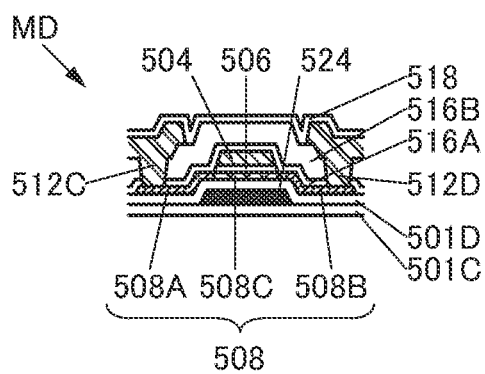

FIG. 4 illustrates a structure of the display panel of one embodiment of the present invention. FIG. 4A is a cross-sectional view taken along cutting lines X1-X2 and X3-X4 in FIG. 1A, and FIG. 4B is a cross-sectional view illustrating part of FIG. 4A.

Figure 5A:
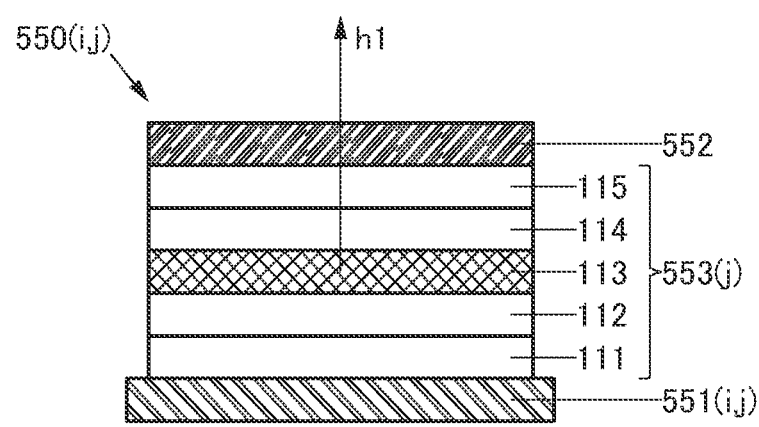
FIG. 5A and FIG. 5B are diagrams each illustrating a structure of a display element of a display panel of an embodiment.
Figure 5B:
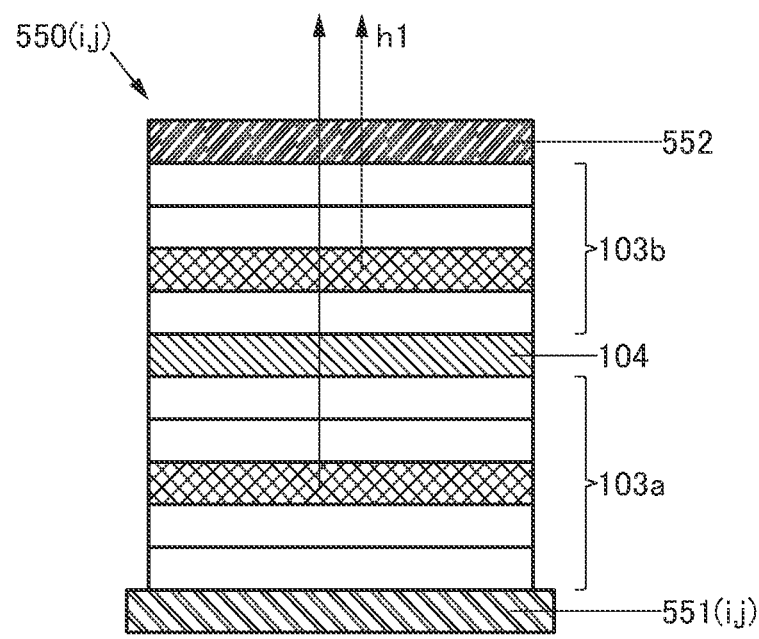

FIG. 5 illustrates a structure of the display panel of one embodiment of the present invention. FIG. 5A and FIG. 5B are cross-sectional views each illustrating the structure of a display element 550(i,j).

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

<Structure Example 1 of Display Panel 700>

The display panel described in this embodiment includes a display region 231, an insulating film 573, and a sealing film 574 (see FIG. 1A and FIG. 2A).

<<Structure Example 1 of Display Region 231>>

The display region 231 includes the pixel 702(i,j).

<<Structure Example 1 of Pixel 702(i,j)>>

The pixel 702(i,j) includes the display element 550(i,j) and a color conversion layer CC(j) (see FIG. 2A and FIG. 3A).

<<Structure Example 1 of Color Conversion Layer CC(j)>>

The color conversion layer CC(j) includes a region that overlaps with the display element 550(i,j) (see FIG. 2A and FIG. 3A).

The color conversion layer CC(j) has a function of converting first light h1 into second light h2. Note that the second light h2 has a spectrum including a high proportion of light with a long wavelength compared with the first light h1.

<<Structure Example 1 of Insulating Film 573>>

The insulating film 573 covers the display element 550(i,j).

<<Structure Example 1 of Sealing Film 574>>

The sealing film 574 includes a region, and the color conversion layer CC(j) is sandwiched between the region and the insulating film 573 (see FIG. 3A).

The sealing film 574 includes a region that is on the outside of the display region 231 and in contact with the insulating film 573 (see FIG. 4A). Films with low moisture permeability can be used as the sealing film 574 and the insulating film 573, for example. Specifically, silicon nitride can be used for the sealing film 574 and the insulating film 573. In addition, it is possible to form a region that is on the outside of the display region 231 and in which the sealing film 574 and the insulating film 573 are in contact with each other.

<<Structure Example 1 of Display Element 550(i,j)>>

The display element 550(i,j) emits the first light h1 (see FIG. 5A). For example, an electrode 551(i,j), an electrode 552, and a layer 553(j) containing a light-emitting material can be used for the display element 550(i,j).

The first display element 550(i,j) includes a layer 111, a layer 112, a layer 113, and a layer 114. The layer 111, the layer 112, the layer 113, and the layer 114 can be formed by a variety of known deposition methods. For example, a vacuum evaporation method or a printing method can be used. Specifically, a resistive heating vacuum evaporation method, an ink-jet method, or the like can be used.

The layer 113 is sandwiched between the layer 112 and the layer 114. The layer 112 is sandwiched between the layer 111 and the layer 113.

The layer 111 contains a material HT1 and a material AM.
The layer 112 contains a material HT2.
The layer 113 contains a light-emitting material EM and a material HOST.
The layer 114 contains a material ET and a material OMC.

[Material HT1]

The material HT1 has a HOMO level higher than or equal to −5.7 eV and lower than or equal to −5.4 eV. For example, a hole-transport material that has a hole-transport property is preferable, and a material having any of a carbazole skeleton, a dibenzofuran skeleton, a dibenzothiophene skeleton, and an anthracene skeleton can be used as the material HT. Alternatively, aromatic amine having a substituent that includes a dibenzofuran ring or a dibenzothiophene ring, aromatic monoamine that includes a naphthalene ring, or aromatic monoamine in which a 9-fluorenyl group is bonded to nitrogen of amine through an arylene group can be used as the material HT. Thus, holes are easily injected into the layer 112.

Specific examples of a compound that can be used as the material HT1 include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4,4'-diphenyl-4''-(6;1'-binaphthyl-2-yl)triphenylamine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yltriphenylamine (abbreviation: BBAPβNB-03), 4,4'-diphenyl-4''-(6;2'-binaphthyl-2-yl)triphenylamine (abbreviation: BBA(βN2)B), 4,4'-diphenyl-4''-(7;2'-binaphthyl-2-yl)triphenylamine (abbreviation: BBA(βN2)B-03), 4,4'-diphenyl-4''-(4;2'-binaphthyl-1-yl)tri phenyl amine (abbreviation: BBAβNαNB), 4,4'-diphenyl-4''-(5;2'-binaphthyl-1-yl)triphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4''-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spiro-bi(9H-fluoren)-2-amine (abbreviation: PCBNBSF), N,N-bis(4-biphenylyl)-9,9'-spirobi[9H-fluoren]-2-amine (abbreviation: BBASF), N,N-bis (1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spiro-bi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9, 9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

[Material AM]

The material AM has an acceptor property. For example, an organic compound or the like that includes an electron-withdrawing group (in particular, a halogen group such as a fluoro group, or a cyano group) is used as the material AM, and a substance that exhibits an electron-accepting property with respect to the material HT1 is selected as appropriate. Examples of such organic compounds include 7,7,8,8-tetracyano-2,3,5,6-tetrafluoroquinodimethane (abbreviation: F4-TCNQ), chloranil, 2,3,6,7,10,11-hexacyano-1,4,5,8,9, 12-hexaazatriphenylene (abbreviation: HAT-CN), 1,3,4,5,7, 8-hexafluorotetracyano-naphthoquinodimethane (abbreviation: F6-TCNNQ), and 2-(7-dicyanomethylen-1,3,4,5,6,8,9, 10-octafluoro-7H-pyren-2-ylidene)malononitrile. A compound in which electron-withdrawing groups are bonded to a condensed aromatic ring having a plurality of heteroatoms, such as HAT-CN, is preferable because it is thermally stable. A [3]radialene derivative having an electron-withdrawing group (in particular, a halogen group such as a fluoro group, or a cyano group) has a very high electron-accepting property and thus is preferable. Specific examples include α,α',α''-1,2,3-cyclopropanetriylidenetris [4-cyano-2,3,5,6-tetrafluorobenzeneacetonitrile], α,α',α''-1, 2,3-cyclopropanetriylidenetris[2,6-di chloro-3,5-difluoro-4-(trifluoromethyl)benzeneacetonitrile], and α,α',α''-1,2,3-cyclopropanetriylidenetris[2,3,4,5,6-pentafluorobenzeneacetonitrile].

[Material HT2]

HT2 has a lower HOMO level than the material HT1. For example, a material selected appropriately from the above compounds shown as the examples of the compound that can be used as the material HT1 can be used as HT2.

[Material HOST]

The material HOST has a lower HOMO level than the material HT2.

For example, a variety of carrier-transport materials such as an electron-transport material, a hole-transport material, and the TADF material can be used as the material HOST. As specific examples of the hole-transport material, the electron-transport material, and the like, one or more kinds of materials appropriately selected from the materials described in this specification or known materials can be used.

[Light-Emitting Material EM]

For example, a substance exhibiting fluorescence (fluorescent substance), a substance exhibiting phosphorescence (phosphorescent substance), a thermally activated delayed fluorescence (TADF) material exhibiting thermally activated delayed fluorescence, or other light-emitting substances can be used as the light-emitting material EM.

[Material ET]

The material ET has a HOMO level higher than or equal to −6.0 eV. Moreover, the material ET has an electron mobility higher than or equal to $1 \times 10^{-7}$ cm$^2$/Vs and lower than or equal to $5 \times 10^{-5}$ cm$^2$/Vs when the square root of the electric field strength [V/cm] is 600.

For example, a compound having an anthracene skeleton can be used as the material ET, and it is further preferable that an anthracene skeleton and a heterocyclic skeleton be contained. The heterocyclic skeleton is preferably a nitrogen-containing five-membered ring skeleton. The nitrogen-containing five-membered ring skeleton particularly preferably includes two heteroatoms in a ring, like a pyrazol ring, an imidazole ring, an oxazole ring, or, a thiazole ring.

[Material OMC]

The material OMC is an organic complex of alkali metal or an organic complex of alkaline earth metal. For example, an organic complex of lithium is preferable, and 8-hydroxyquinolinato-lithium (abbreviation: Liq) is particularly preferable.

Note that an anion may be generated in a layer that is on the layer 114 side than the layer 113. Alternatively, the display element 550(*i,j*) may be degraded by an anion after the start of use. Alternatively, the luminance of the display element 550(*i,j*) may be decreased.

Thus, a decrease in display quality that would occur after the start of use can be inhibited. Alternatively, a decrease in color reproducibility that would occur after the start of use can be inhibited. Alternatively, a decrease in luminance that would occur after the start of use can be inhibited. Alternatively, entry of impurities that would degrade characteristics can be inhibited. Alternatively, a bright color can be displayed. Alternatively, productivity is high. As a result, a novel display panel that is highly convenient or reliable can be provided.

<<Structure Example 2 of Color Conversion Layer CC(j)>>

The color conversion layer CC(j) includes quantum dots and a light-transmitting resin (see FIG. 3A). For example, quantum dots can be covered with a resin that has a light-transmitting property and does not generate any gas. Alternatively, a resin polymerized with quantum dots can be used. Alternatively, a photosensitive polymer that covers quantum dots can be used. With the use of a photosensitive polymer, a fine color conversion layer CC(I) can be formed.

Thus, the spectral width of the second light h2 can be narrowed. Alternatively, light with a narrow half width of a spectrum can be used. Alternatively, a color with high saturation can be displayed. Alternatively, aggregation of the quantum dots can be prevented. As a result, a novel display panel that is highly convenient or reliable can be provided.

<<Structure Example 2 of Display Element 550(i,j)>>

The display element 550(i,j) emits blue light as the first light h1.

Thus, blue light can be converted into green light. Alternatively, blue light can be converted into red light. Alternatively, blue light can be converted into light with a longer wavelength. As a result, a novel display panel that is highly convenient or reliable can be provided.

<<Structure Example 3 of Display Element 550(i,j)>>

The display element 550(i,j) includes a light-emitting unit 103a, a light-emitting unit 103b, and an intermediate layer 104 (see FIG. 5B).

The intermediate layer 104 includes a region sandwiched between the light-emitting unit 103a and the light-emitting unit 103b. The intermediate layer 104 supplies holes to one of the light-emitting unit 103a and the light-emitting unit 103b and supplies electrons to the other thereof.

The light-emitting unit 103a emits blue light, and the light-emitting unit 103b also emits blue light.

Accordingly, the current efficiency of light emission can be increased. Alternatively, power consumption can be reduced. As a result, a novel display panel that is highly convenient or reliable can be provided.

<Structure Example 2 of Display Panel 700>

The display panel described in this embodiment includes a functional layer 520.

<<Structure Example 1 of Functional Layer 520>>

The functional layer 520 includes a region that overlaps with the display element 550(i,j).

The functional layer 520 includes the pixel circuit 530(i,j). The functional layer 520 has an opening portion 591A.

<<Structure Example 1 of Pixel 702(i,j)>>

The pixel 702(i,j) includes the pixel circuit 530(i,j).

<<Structure Example 1 of Pixel Circuit 530(i,j)>>

The pixel circuit 530(i,j) is electrically connected to the first display element 550(i,j) in the opening portion 591A.

Accordingly, the operation of the display element can be controlled. As a result, a novel display panel that is highly convenient or reliable can be provided.

<<Structure Example 2 of Display Region 231>>

The display region 231 includes a pixel 702(i,j+1) and a pixel 702(i,j+2).

The pixel 702(i,j) displays red.

The pixel 702(i,j+1) displays green. In addition, the pixel 702(i,j+1) includes a second color conversion layer CC(j+1).

The pixel 702(i,j+2) displays blue.

The color conversion layer CC(j) converts blue light into red light.

The color conversion layer CC(j+1) converts blue light into green light.

Thus, a full-color image can be displayed. Alternatively, the degree of decrease in the luminance of the display element, which would occur after the start of use, can be substantially the same among a plurality of pixels that display different colors. Alternatively, the degree of deterioration of the display elements, which is caused by the use, can be substantially the same among the plurality of pixels. Alternatively, a decrease in color reproducibility that would occur after the start of use can be inhibited. As a result, a novel display panel that is highly convenient or reliable can be provided.

<<Structure Example 2 of Pixel Circuit 530(i,j)>>

The pixel circuit 530(i,j) includes a transistor M, a node N1(i,j), a switch SW21, a capacitor C21, a capacitor C22, and a switch SW22 (see FIG. 2B).

The transistor M includes a first electrode electrically connected to the display element 550(i,j), and a second electrode electrically connected to a conductive film ANO.

The node N1(i,j) is electrically connected to a gate electrode of the transistor M. Note that the display element 550(i,j) performs display on the basis of on a potential VN.

The switch SW21 includes a first terminal electrically connected to the node N1(i,j) and a second terminal electrically connected to a conductive film. For example, a signal line S1(j) can be used as the conductive film. Note that the switch SW21 has a function of switching a conduction state and a non-conduction state on the basis of a selection signal, for example.

The capacitor C21 includes a first electrode electrically connected to the node N1(i,j) and a second electrode electrically connected to a conductive film. For example, the conductive film ANO can be used as the conductive film.

The capacitor C22 includes a first electrode electrically connected to the node N1(i,j) and a second electrode electrically connected to a first terminal of the switch SW22.

The switch SW22 includes the first terminal electrically connected to a conductive film. For example, a signal line S2(j) can be used as the conductive film. Note that the switch SW22 has a function of switching between a conducting state and a non-conducting state on the basis of a second selection signal, for example.

When the switch SW21 is in a non-conducting state, the switch SW22 can change from a non-conducting state to a conducting state. When the switch SW21 is in a non-conducting state, the switch SW22 can change from a conducting state to a non-conducting state.

In this manner, the potential of the node N1(i,j) can be controlled using the switch SW21 and the switch SW22. Alternatively, the potential of the node N1(i,j) can be controlled using the switch SW21, and the potential of the node N1(i,j) can be changed using the switch SW22. Alternatively, the changing potential can be supplied to the display element 550(i,j). Alternatively, display can be performed on the basis of the changing potential. Alternatively, the display of the display element 550(i,j) can be changed. Alternatively, an operation of the display element 550(i,j) can be emphasized. Alternatively, the response of the display element 550(i,j) can be made faster. As a result, a novel display panel that is highly convenient or reliable can be provided.

<<Structure Example 3 of Pixel Circuit 530(i,j)>>

A bottom-gate transistor or a top-gate transistor can be used in the pixel circuit 530(i,j), for example. Specifically, a transistor can be used as a switch.

<<Structure Example of Transistor>>

The transistor includes a semiconductor film 508, a conductive film 504, a conductive film 512A, and a conductive film 512B (see FIG. 3B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region that overlaps with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is positioned between a region of the conductive film 524 and the conductive film 504. The conductive film 524 has a function of a second gate electrode.

Note that in a process of forming the semiconductor film used in the transistor of the pixel circuit, the semiconductor film used in the transistor of the driver circuit can be formed.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the driving capability can be higher than that of a transistor using hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor using hydrogenated amorphous silicon for the semiconductor film 508.

Alternatively, the temperature required for fabrication of the transistor can be lower than that required for a transistor using single crystal silicon, for example.

Alternatively, the semiconductor film used for the transistor of the driver circuit can be formed in the same step as the semiconductor film used for the transistor of the pixel circuit. Alternatively, the driver circuit can be formed over the same substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head-mounted display can be provided.

<<Structure Example 2 of Semiconductor Film 508>>

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of the information processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used for a switch or the like. In that case, the potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is positioned between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is positioned between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

Accordingly, flickering can be inhibited. Alternatively, power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

<<Structure Example 3 of Semiconductor Film 508>>

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

<<Structure Example of Capacitor>>

A capacitor includes one conductive film, a different conductive film, and an insulating film. The insulating film includes a region sandwiched between the one conductive film and the different conductive film.

For example, the conductive film 504, the conductive film 512A, and the insulating film 506 can be used for the capacitor.

<<Structure Example 2 of Functional Layer 520>>

The functional layer 520 includes an insulating film 521, an insulating film 518, an insulating film 516, the insulating film 506, an insulating film 501C, and the like (see FIG. 3A).

The insulating film 521 includes a region sandwiched between the pixel circuit 530(ii) and the display element 550(i,j).

The insulating film 518 includes a region sandwiched between the insulating film 521 and the insulating film 501C.

The insulating film 516 includes a region sandwiched between the insulating film 518 and the insulating film 501C.

The insulating film 506 includes a region sandwiched between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can eliminate a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Structural Example 1 of Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region sandwiched between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

<<Structure Example 3 of Functional Layer 520>>

The functional layer 520 includes a conductive film, a wiring, and a terminal. A material having conductivity can be used for the wiring, an electrode, the terminal, the conductive film, and the like.

<<Wiring and the Like>>

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 using a conductive material ACF1, for example (see FIG. 2A). Specifically, the terminal 519B can be electrically connected to the flexible printed circuit FPC1 with the use of a conductive material CP.

<Structure Example 3 of Display Panel 700>

The display panel 700 includes a base material 510, a base material 770, and a sealant 705 (see FIG. 3A).

<<Base Material 510 and Base Material 770>>

A material having a light-transmitting property can be used for the base material 510 or the base material 770.

For example, a flexible material can be used for the base material 510 or the base material 770. Thus, a flexible display panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or a resin can be prevented. Alternatively, diffusion of impurities that pass through a resin can be prevented.

Furthermore, paper, wood, or the like can be used for the base material 510 or the base material 770.

For example, a material having heat resistance high enough to withstand heat treatment in the fabrication process can be used for the base material 510 or the base material 770. Specifically, a material having heat resistance to heat applied in the fabrication process of directly forming the transistor, the capacitor, or the like can be used for the base material 510 or the base material 770.

For example, it is possible to employ a method in which an insulating film, a transistor, a capacitor, or the like is formed on a substrate that is for use in the process and has heat resistance to heat applied in the fabrication process, and the formed insulating film, transistor, capacitor, or the like is transferred to, for instance, the base material 510 or the base material 770. Accordingly, an insulating film, a transistor, a capacitor, or the like can be formed on a flexible substrate, for example.

<<Sealant 705>>

The sealant 705 includes a region sandwiched between the functional layer 520 and the base material 770 and has a function of bonding the functional layer 520 and the base material 770 together (see FIG. 3A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<Structure Example 4 of Display Panel 700>

The display panel 700 includes the color conversion layer CC(j), a light-blocking film BM, a structure body KB1, a functional film 770P, and the like.

<<Color conversion layer CC(j)>>

The color conversion layer CC(j) includes a region sandwiched between the base material 770 and the display element 550($i,j$). The color conversion layer CC(j) can be formed by a photolithography method, for example. Alternatively, the color conversion layer CC(j+1) that is different from the color conversion layer CC(j) can be formed next to the color conversion layer CC(j). Thus, the color conversion layer CC(j) with high definition can be formed.

For example, a material that emits light with a wavelength longer than a wavelength of incident light can be used for the color conversion layer CC(j). For example, a material that absorbs blue light or ultraviolet rays, converts it into green light, and emits the green light, a material that absorbs blue light or ultraviolet rays, converts it into red light, and emits the red light, or a material that absorbs ultraviolet light, converts it into blue light, and emits the blue light can be used for the color conversion layer. Specifically, a quantum dot with a diameter of several nanometers can be used for the color conversion layer CC(j). Alternatively, perovskite can be used for the color conversion layer CC(j). Thus, light having a spectrum with a narrow half width can be emitted. Alternatively, light with high saturation can be emitted.

For example, a single film or a stacked film in which a plurality of films are stacked can be used as the color conversion layer CC(j). Specifically, a stacked film in which a film formed by a method that hardly damages the display element 550($i,j$) and a dense film with a few defects are stacked can be used as the color conversion layer CC(j). Thus, diffusion of impurities into the display element 550($i,j$) can be inhibited. The reliability of the display element 550($i,j$) can be increased.

<<Light-Blocking Film BM>>

The light-blocking film BM includes an opening portion in a region overlapping with the pixel 702($i,j$). For example, a material of a dark color can be used for the light-blocking film BM. Thus, the display contrast can be increased.

<<Structure Body KB1>>

The structure body KB1 includes a region sandwiched between the functional layer 520 and the base material 770. The structure body KB1 has a function of providing a predetermined space between the functional layer 520 and the base material 770.

<<Functional Film 770P and the Like>>

The functional film 770P includes a region overlapping with the display element 550($i,j$).

An anti-reflection film, a polarizing film, a retardation film, a light diffusion film, a condensing film, or the like can be used as the functional film 770P, for example.

For example, an anti-reflection film with a thickness less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film that self-heals from generated scratches, or the like can be used as the functional film 770P.

<Structure Example 5 of Display Panel 700>

The display panel 700 includes an insulating film 528, the insulating film 573, and the sealing film 574 (see FIG. 3A).

<<Insulating Film 528>>

The insulating film 528 includes a region sandwiched between the functional layer 520 and the base material 770, and the insulating film 528 includes an opening portion in a region overlapping with the display element 550($i,j$) (see FIG. 3A).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

The insulating film 573 includes a region, and the display element 550($i,j$) is sandwiched between the region and the functional layer 520 (see FIG. 3A).

For example, a single film or a stacked film in which a plurality of films are stacked can be used as the insulating film 573. Specifically, a stacked film in which an insulating film 573A formed by a method that hardly damages the display element 550($i,j$) and a dense insulating film 573B with a few defects are stacked can be used as the insulating film 573. Thus, diffusion of impurities into the display element 550($i,j$) can be inhibited. The reliability of the display element 550($i,j$) can be increased.

<<Sealing Film 574>>

The material that can be used for the insulating film 521, for example, can be used for the sealing film 574. Alternatively, a stacked film in which a resin 574A having a light-transmitting property and a film 574B with low moisture permeability are stacked can be used as the sealing film 574 (see FIG. 4A). Alternatively, a resin that does not generate any gas can be used as the resin 574A having a light-transmitting property. Specifically, silicon nitride can be used for the film 574B with low moisture permeability.

The insulating film 521 can be deposited by a sputtering method, for example. Specifically, the deposition can be performed at a temperature higher than or equal to room temperature and lower than or equal to 100° C.

<<Structure Example of Display Element 550($i,j$)>>

An element controlling light emission can be used as the display element 550($i,j$). A light-emitting element can be used as the display element 550($i,j$), for example.

Specifically, an organic electroluminescence element, an inorganic electroluminescence element, a light-emitting diode, a QDLED (Quantum Dot LED), or the like can be used as the display element 550($i,j$) (see FIG. 3A).

For example, the layer 553($j$) containing a light-emitting material can be used for the display element 550($i,j$).

<<Structure Example 3 of Layer 553($j$) Containing Light-Emitting Material>>

A stacked-layer material stacked to emit blue light or ultraviolet rays can be used for the layer 553($j$) containing a light-emitting material, for example. Furthermore, a layer that converts blue light or ultraviolet rays into light with a different hue can be used to overlap with the layer 553($j$) containing a light-emitting material, for example. Thus, for example, blue light can be converted into the light of a predetermined hue. Alternatively, pixels displaying different hues can be arranged without separate formation of the layer 553(j) containing a light-emitting material.

<<Structure Example 4 of Layer 553(j) Containing Light-Emitting Material>>

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) containing a light-emitting material, for example. The intermediate layer includes a region sandwiched between two light-emitting units. The intermediate layer includes a charge-generation region, and the intermediate layer has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

Accordingly, the current efficiency of light emission can be increased. Alternatively, the density of current flowing through the light-emitting element at the same luminance can be reduced. Alternatively, the reliability of the light-emitting element can be increased.

For example, a light-emitting unit containing a material emitting light with one hue and a light-emitting unit containing a material emitting light with a different hue can be stacked and used for the layer 553(j) containing a light-emitting material. Alternatively, a light-emitting unit containing a material emitting light with one hue and a light-emitting unit containing a material emitting light with the same hue can be stacked and used for the layer 553(j) containing a light-emitting material. Specifically, two light-emitting units each containing a material emitting blue light can be stacked and used.

For the layer 553(j) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

<<Electrode 551(i,j) and Electrode 552>>

For example, the material that can be used for the wiring or the like can be used for the electrode 551(i,j) or the electrode 552. Specifically, a material that has a transmitting property with respect to visible light can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a transmitting property with respect to visible light can be used.

For example, a metal film that transmits part of light and reflects another part of the light can be used for the electrode 551(i,j) or the electrode 552. The distance between the electrode 551(i,j) and the electrode 552 is adjusted using the layer 553(j) containing a light-emitting material, for example.

Thus, a microcavity structure can be provided in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that efficiently reflects light can be used for the electrode 551(i,j) or the electrode 552. Specifically, a material containing silver, palladium, and the like or a material containing silver, copper, and the like can be used for the metal film.

The electrode 551(i,j) is electrically connected to the pixel circuit 530(i,j) in the opening portion 591A (see FIG. 3A). The electrode 551(i,j) overlaps with the opening portion formed in the insulating film 528, and the insulating film 528 is at the periphery of the electrode 551(i,j), for example.

Thus, a short circuit between the electrode 551(i,j) and the electrode 552 can be prevented.

<<Structure Example 2 of Display Region 231>>

The display region 231 includes a plurality of pixels. For example, a plurality of pixels having a function of displaying colors with different hues can be used for the display region 231.

This enables additive mixture or subtractive mixture of colors displayed by the plurality of pixels. Alternatively, it is possible to display a color of a hue that an individual pixel cannot display.

Note that in the case where a plurality of pixels capable of displaying colors with different hues are used for color mixture, each of the pixels can be rephrased as a subpixel. In addition, a set of subpixels can be rephrased as a pixel.

For example, the pixel 702(i,j) can be rephrased as a subpixel, and a set of the pixel 702(i,j), the pixel 702(i,j+1), and the pixel 702(i,j+2) can be rephrased as a pixel 703(i,k) (see FIG. 1C).

Specifically, a set of a subpixel displaying blue, a subpixel displaying green, and a subpixel displaying red can be used as the pixel 703(i,k). Alternatively, a set of a subpixel displaying cyan, a subpixel displaying magenta, and a subpixel displaying yellow can be used as the pixel 703(i,k).

Furthermore, the above set to which a subpixel displaying white or the like is added can be used as the pixel, for example.

<<Structure Example 3 of Display Region 231>>

The display region 231 includes the pixel 702(i,j), the pixel 702(i,j+1), and the pixel 702(i,j+2) (see FIG. 1C).

The pixel 702(i,j) displays blue having a chromaticity x of greater than or equal to 0.120 and less than or equal to 0.170 and a chromaticity y of greater than or equal to 0.020 and less than 0.060 in the CIE1931 chromaticity coordinates.

The pixel 702(i,j+1) displays green having a chromaticity x of greater than or equal to 0.130 and less than or equal to 0.250 and a chromaticity y of greater than 0.710 and less than or equal to 0.810 in the CIE1931 chromaticity coordinates.

The pixel 702(i,j+2) displays red having a chromaticity x of greater than 0.680 and less than or equal to 0.720 and a chromaticity y of greater than or equal to 0.260 and less than or equal to 0.320 in the CIE1931 chromaticity coordinates.

The pixel 702(i,j), the pixel 702(i,j+1), and the pixel 702(i,j+2) are provided so that the area ratio of their color gamut to the BT.2020-2 color gamut in the CIE chromaticity diagram can be higher than or equal to 80%, or alternatively, the color gamut coverage can be higher than or equal to 75%. Preferably, they are provided so that the area ratio can be higher than or equal to 90%, or alternatively, the coverage can be higher than or equal to 85%.

Accordingly, display with an extremely wide color gamut satisfying a color gamut of Recommendation ITU-R BT.2020-2 standard, which is an international standard, can be performed. Alternatively, extremely high-resolution display can be performed.

Note that this embodiment can be combined with any of the other embodiments in this specification as appropriate.

Embodiment 2

In this embodiment, a structure of a display panel of one embodiment of the present invention will be described with reference to FIG. 6.

Figure 6:
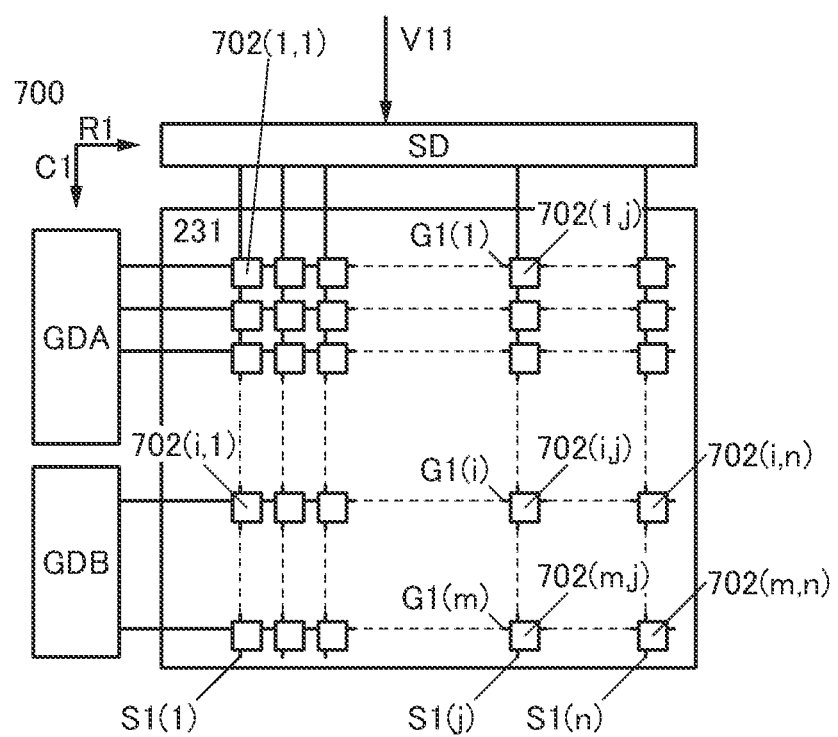
FIG. 6 is a block diagram illustrating a structure of a display panel of an embodiment.

FIG. 6 is a diagram illustrating the structure of the display panel of one embodiment of the present invention.

<Structure Example 1 of Display Panel 700>

The display panel 700 described in this embodiment includes the display region 231 (see FIG. 6).

<<Structure Example 1 of Display Region 231>>

The display region 231 includes a group of pixels 702($i$,1) to 702($i$,$n$), a different group of pixels 702($i$,$j$) to 702($m$,$j$), a scan line G1($i$), and the signal line S1($j$) (see FIG. 6). Note that i is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and the conductive film ANO.

The group of pixels 702($i$,1) to 702($i$,$n$) is arranged in the row direction (the direction indicated by an arrow R1 in the drawing), and the group of pixels 702($i$,1) to 702($i$,$n$) includes the pixel 702($i$,$j$).

The different group of pixels 702(1,$j$) to 702($m$,$j$) is arranged in the column direction intersecting the row direction (the direction indicated by an arrow C1 in the diagram), and the different group of pixels 702(1,$j$) to 702($m$,$j$) includes the pixel 702($i$,$j$).

The scan line G1($i$) is electrically connected to the group of pixels 702($i$,1) to 702($i$,$n$) arranged in the row direction.

The signal line S1($j$) is electrically connected to the different group of pixels 702(1,$j$) to 702($m$,$j$) arranged in the column direction.

Thus, image data can be supplied to a plurality of pixels. As a result, a novel display panel that is highly convenient or reliable can be provided.

<<Structure Example 2 of Display Region 231>>

The display region 231 includes 600 or more pixels per inch. Note that the pixels include the pixel 702($i$,$j$).

<<Structure Example 3 of Display Region 231>>

The display region 231 includes a plurality of pixels in a matrix. For example, the display region 231 includes 7600 or more pixels in the row direction and the display region 231 includes 4300 or more pixels in the column direction. Specifically, 7680 pixels are provided in the row direction and 4320 pixels are provided in the column direction.

Thus, a high-resolution image can be displayed. As a result, a novel display panel that is highly convenient or reliable can be provided.

<Structure Example 2 of Display Panel 700>

The display panel 700 described in this embodiment includes one or more driver circuits. For example, a driver circuit GD and a driver circuit SD can be included (see FIG. 6).

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal on the basis of a control signal SP.

Specifically, the driver circuit GDA and the driver circuit GDB each have a function of supplying a selection signal to one scan line at a frequency of 30 Hz or higher, preferably 60 Hz or higher, on the basis of the control signal SP. Accordingly, a moving image can be smoothly displayed.

Alternatively, the driver circuit GDA and the driver circuit GDB each have a function of supplying a selection signal to one scan line at a frequency lower than 30 Hz, preferably lower than 1 Hz, further preferably less than once a minute, on the basis of the control signal SP. Accordingly, a still image in which flickering is reduced can be displayed.

In the case where a plurality of driver circuits are included, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency higher than or equal to 1 Hz and lower than or equal to 120 Hz. Alternatively, display can be performed at a frame frequency of 120 Hz by a progressive method.

A bottom-gate transistor or a top-gate transistor can be used in the driver circuit GD, for example. Specifically, a transistor MD can be used in the driver circuit GD (see FIG. 4).

Note that the semiconductor film used for the transistor of the driver circuit GD can be formed, for example, in a step of forming the semiconductor film used for the transistor of the pixel circuit 530($i$,$j$).

<<Driver Circuit SD>>

The driver circuit SD has a function of generating an image signal on the basis of information V11 and a function of supplying the image signal to a pixel circuit electrically connected to one display element (see FIG. 6).

A variety of sequential circuits such as a shift register can be used as the driver circuit SD, for example.

For example, an integrated circuit formed on a silicon substrate can be used as the driver circuit SD.

An integrated circuit can be connected to a terminal by a COG (Chip on glass) method or a COF (Chip on Film) method, for example. Specifically, an anisotropic conductive film can be used to connect an integrated circuit to a terminal.

Note that this embodiment can be combined with any of the other embodiments in this specification as appropriate.

Embodiment 3

In this embodiment, a structure of a display device of one embodiment of the present invention will be described with reference to FIG. 7.

FIG. 7 is a diagram illustrating the structure of the display device of one embodiment of the present invention. FIG. 7A is a block diagram of the display device of one embodiment of the present invention, and FIG. 7B to FIG. 7D are projection views each illustrating the appearance of the display device of one embodiment of the present invention.

<Structure Example of Display Device>

Figure 7A:
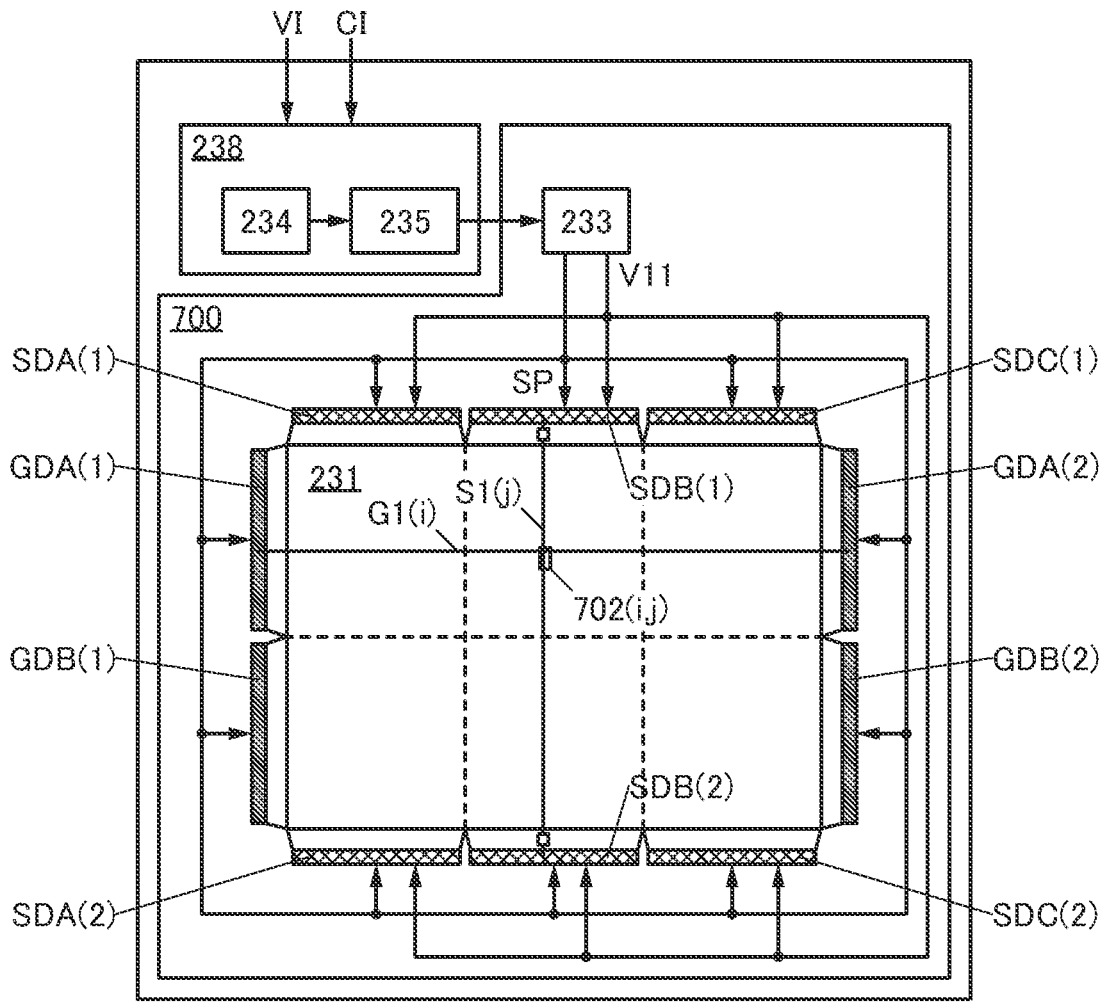
FIG. 7A to FIG. 7D are diagrams illustrating a structure of a display device of an embodiment.
Figure 7B:
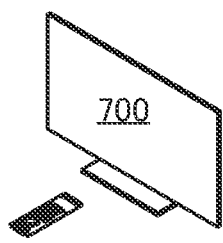
Figure 7C:
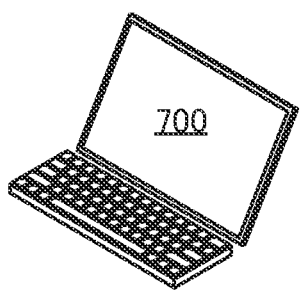
Figure 7D:
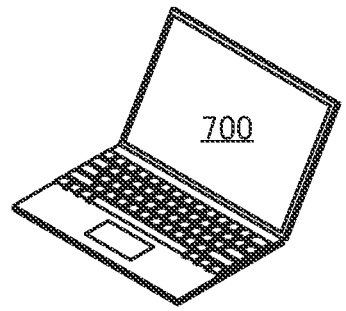

The display device described in this embodiment includes the display panel 700 and a control portion 238 (see FIG. 7A).

<<Structure Example 1 of Control Portion 238>>

The control portion 238 is supplied with image information VI and control information CI. For example, a clock signal, a timing signal, or the like can be used as the control information CI.

The control portion 238 generates information V11 on the basis of the image information VI and generates a control signal SP on the basis of the control information CI. Furthermore, the control portion 238 supplies the information V11 and the control signal SP.

The information V11 includes a grayscale of 8 bits or more, preferably 12 bits or more, for example. In addition, a clock signal, a start pulse, or the like of a shift register used for a driver circuit can be used as the control signal SP, for example.

<Structure Example 2 of Control Portion 238>

For example, a decompression circuit 234 and an image processing circuit 235 can be used in the control portion 238.

<<Decompression Circuit 234>>

The decompression circuit 234 has a function of decompressing the image information VI supplied in a compressed state. The decompression circuit 234 includes a memory portion. The memory portion has a function of storing the decompressed image information, for example.

<<Image Processing Circuit 235>>

The image processing circuit 235 includes a memory region, for example. The memory region has a function of storing information included in the image information VI, for example.

The image processing circuit 235 has a function of generating the information V11 by correcting the image information VI on the basis of a predetermined characteristic curve and a function of supplying the information V11, for example.

<<Structure Example 1 of Display Panel>>

The display panel 700 is supplied with the information V11 and the control signal SP. For example, the display panel 700 includes a driver circuit. Specifically, the display panel 700 described in Embodiment 1 or Embodiment 2 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1) and a driver circuit GDB(2) can be used in the display panel. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and the driver circuit SDC(1) can be used in the display panel. The driver circuit SDA(1), the driver circuit SDA(2), the driver circuit SDB(1), the driver circuit SDB(2), the driver circuit SDC(1), and the driver circuit SDC(1) are supplied with the control signal SP and the information V11 and capable of supplying an image signal.

<<Structure Example of Pixel 702(i,j)>>

The pixel 702(i,j) performs display on the basis of the information V11.

Thus, the image information can be displayed using the display element. As a result, a novel display device that is highly convenient or reliable can be provided. Alternatively, for example, a television receiver system (see FIG. 7B), a video monitor (see FIG. 7C), a laptop computer (see FIG. 7D), or the like can be provided.

<<Structure Example 2 of Display Panel>>

For example, a control circuit 233 can be used in the display panel 700. Specifically, the control circuit 233 formed over a rigid substrate can be used for the display panel 700. The control circuit 233 formed over the rigid substrate can be electrically connected to the control portion 238 with the use of a flexible printed circuit.

<<Control Circuit 233>>

The control circuit 233 has a function of generating and supplying the control signal SP. For example, a clock signal or a timing signal can be used as the control signal SP. Specifically, a timing controller can be used as the control circuit 233.

Note that this embodiment can be combined with any of the other embodiments in this specification as appropriate.

Embodiment 4

In this embodiment, a structure of an input/output device of one embodiment of the present invention will be described with reference to FIG. 8.

Figure 8:
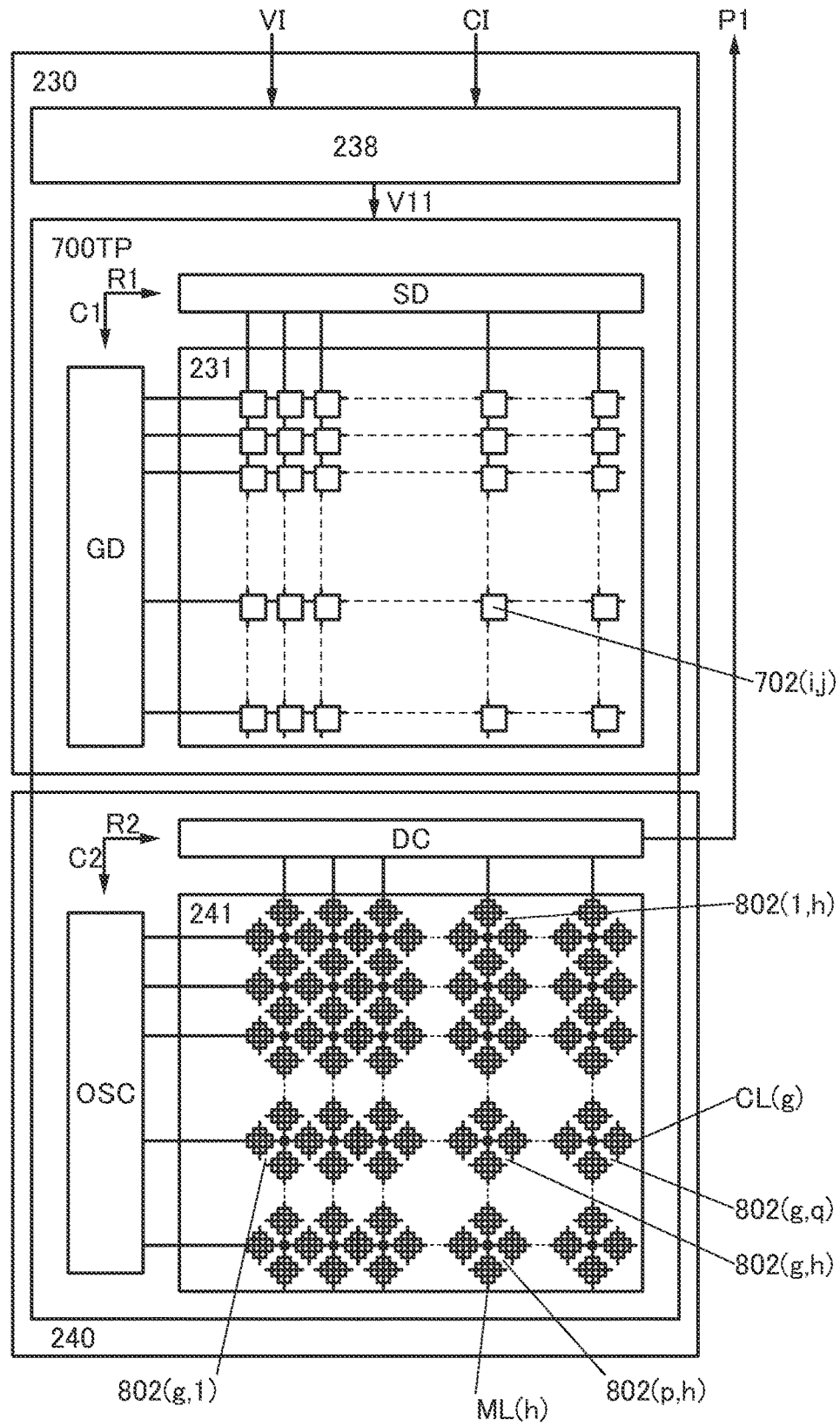
FIG. 8 is a block diagram illustrating a structure of an input/output device of an embodiment.

FIG. 8 is a block diagram illustrating the structure of the input/output device of one embodiment of the present invention.

<Structure Example 1 of Input/Output Device>

The input/output device described in this embodiment includes an input portion 240 and a display portion 230 (see FIG. 8).

<<Display Portion 230>>

The display portion 230 includes a display panel. For example, the display panel 700 described in Embodiment 1 or Embodiment 2 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 has a function of sensing an object approaching the sensing region 241.

The sensing region 241 includes a region overlapping with the pixel 702(i,j).

Thus, the object approaching the region overlapping with the display portion can be sensed while image information is displayed using the display portion. Alternatively, a finger or the like that approaches the display portion can be used as a pointer to input positional information. Alternatively, positional information can be associated with image information displayed on the display portion. As a result, a novel input/output device that is highly convenient or reliable can be provided.

<<Structure Example 1 of Sensing Region 241>>

The sensing region 241 includes one or more sensors, for example.

The sensing region 241 includes a group of sensors 802(g,1) to 802(g,q) and a different group of sensors 802(1,h) to 802(p,h). Note that g is an integer greater than or equal to 1 and less than or equal top, h is an integer greater than or equal to 1 and less than or equal to q, and p and q are each an integer greater than or equal to 1.

The group of sensors 802(g,1) to 802(g,q) includes a sensor 802(g,h) and is provided in the row direction (the direction indicated by an arrow R2 in the diagram). Note that the direction indicated by the arrow R2 may be the same as or different from the direction indicated by the arrow R1.

The different group of sensors 802(1,*h*) to 802(*p,h*) includes the sensor 802(*g,h*) and is provided in the column direction (the direction indicated by an arrow C2 in the drawing) that intersects the row direction.

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a sensor that senses a stylus pen can be used in combination.

This allows determination of the kind of a pointer. Alternatively, different instructions can be associated with pieces of sensing information depending on the kind of a pointer that has been determined. Specifically, in the case where it is determined that a finger is used as a pointer, sensing information can be associated with a gesture. Alternatively, in the case where it is determined that a stylus pen is used as a pointer, sensing information can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

<<Structure Example 2 of Input Portion 240>>

The input portion 240 includes an oscillation circuit OSC and a sensing circuit DC (see FIG. 8).

The oscillation circuit OSC supplies a search signal to the sensor 802(*g,h*). For example, a rectangular wave, a sawtooth wave, a triangular wave, or a sine wave can be used as the search signal.

The sensor 802(*g,h*) generates and supplies a sensing signal that changes in accordance with the search signal and the distance to a pointer approaching the sensor 802(*g,h*).

The sensing circuit DC supplies input information in accordance with the sensing signal.

Accordingly, the distance from an approaching pointer to the sensing region 241 can be sensed. Alternatively, the position in the sensing region 241 where the pointer comes the closest can be sensed.

Note that this embodiment can be combined with any of the other embodiments in this specification as appropriate.

Embodiment 5

In this embodiment, structures of an information processing device of one embodiment of the present invention will be described with reference to FIG. 9 to FIG. 11.

Figure 9A:
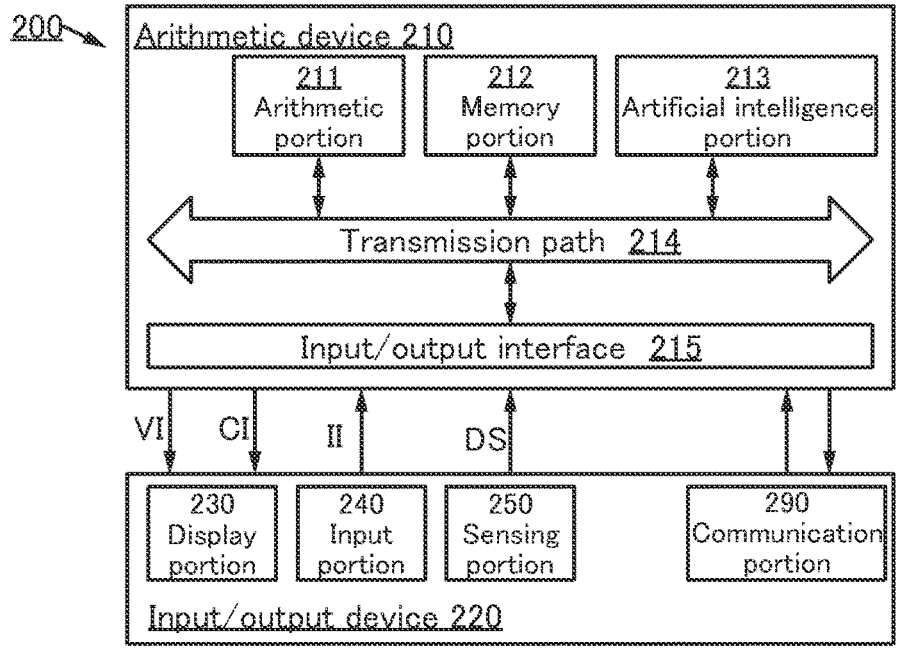
FIG. 9A to FIG. 9C are a block diagram and projection views each illustrating a structure of an information processing device of an embodiment.
Figure 9B:
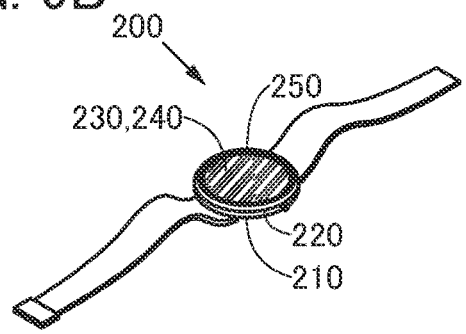
Figure 9C:
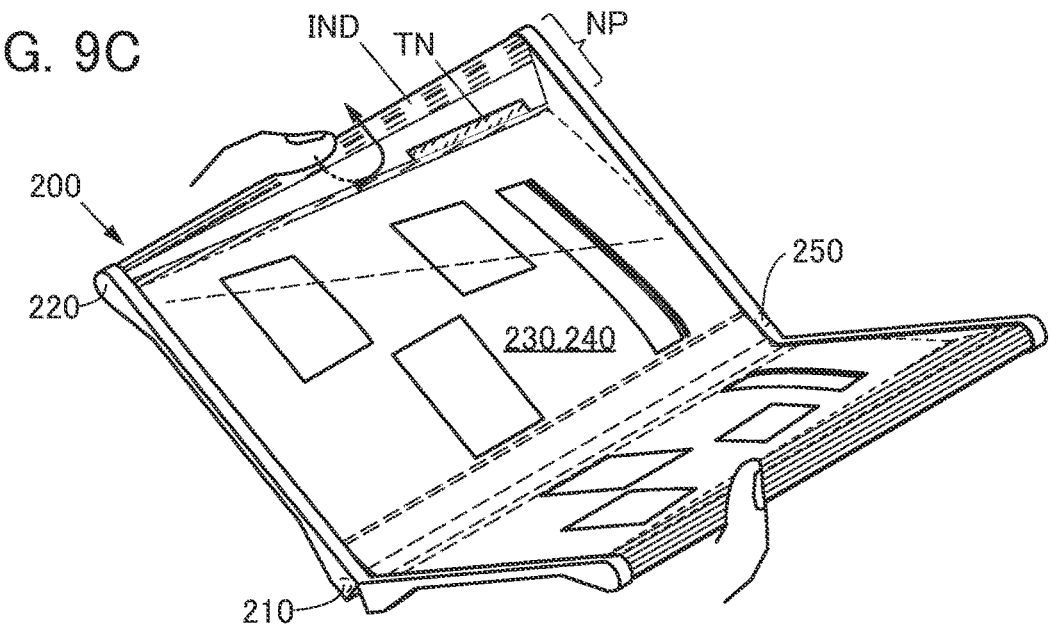

FIG. 9A is a block diagram illustrating the structure of the information processing device of one embodiment of the present invention. FIG. 9B and FIG. 9C are projection views illustrating examples of the appearance of the information processing device.

Figure 10A:
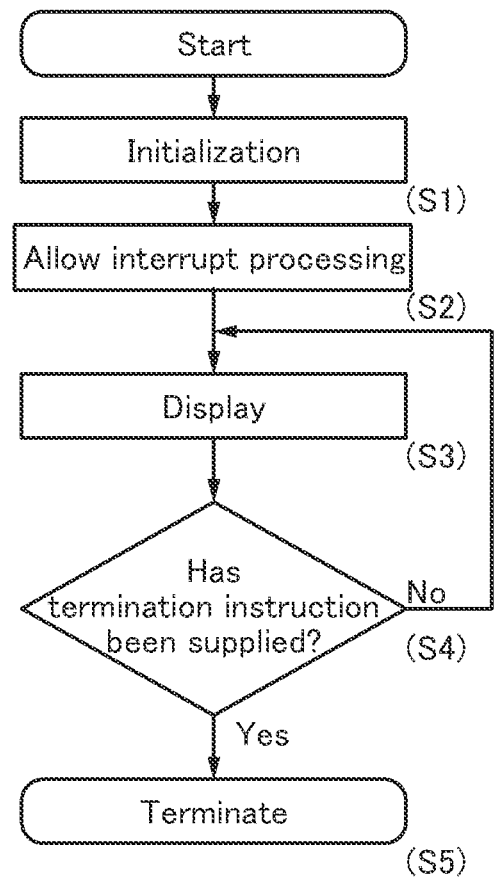
FIG. 10A and FIG. 10B are flow charts showing a method for driving an information processing device of an embodiment.
Figure 10B:
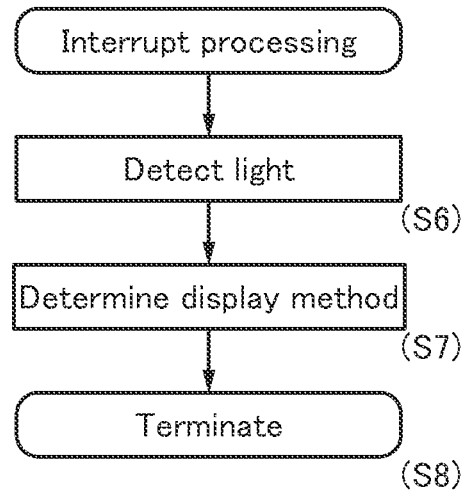

FIG. 10 shows flow charts showing a program of one embodiment of the present invention. FIG. 10A is a flow chart showing main processing of the program of one embodiment of the present invention, and FIG. 10B is a flow chart showing interrupt processing.

Figure 11A:
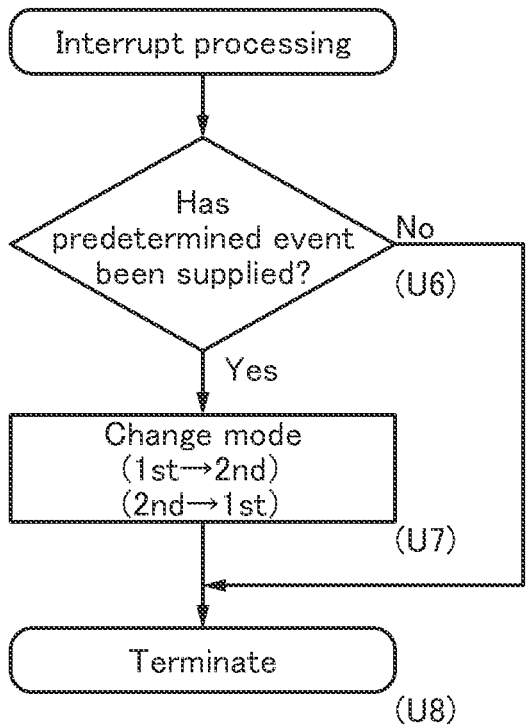
FIG. 11A to FIG. 11C are diagrams showing a method for driving an information processing device of an embodiment.
Figure 11B:
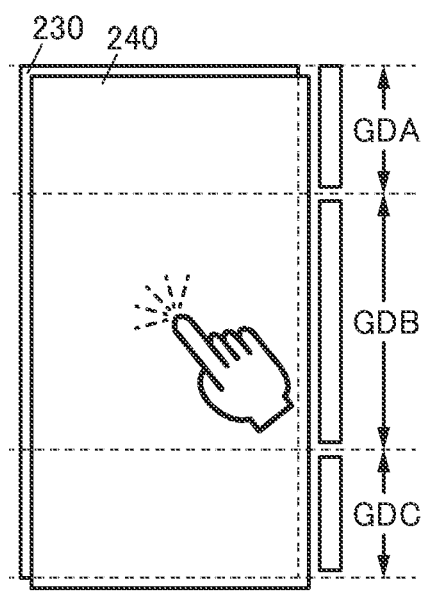
Figure 11C:
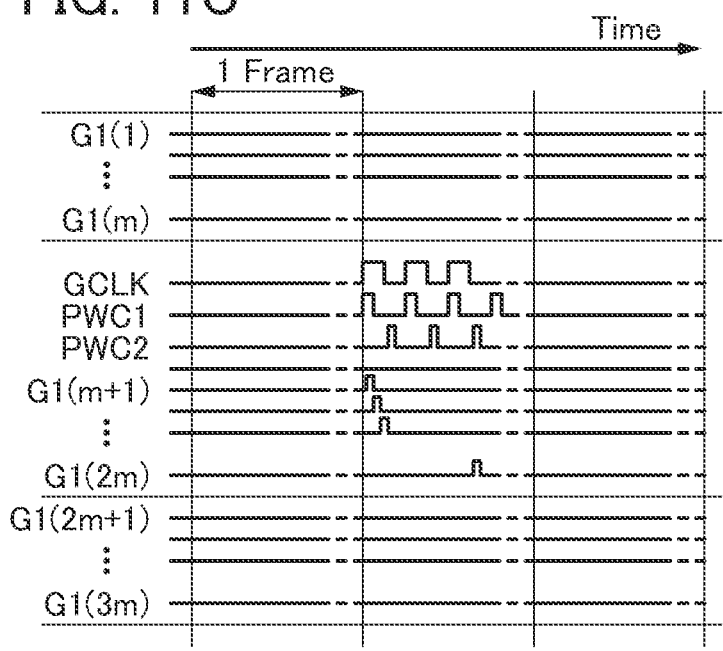

FIG. 11 shows a program of one embodiment of the present invention. FIG. 11A is a flow chart showing interrupt processing of the program of one embodiment of the present invention. FIG. 11B is a schematic view illustrating operation of the information processing device, and FIG. 11C is a timing chart showing operation of the information processing device of one embodiment of the present invention.

<Structure Example 1 of Information Processing Device>

The information processing device described in this embodiment includes an arithmetic device 210 and an input/output device 220 (see FIG. 9A). Note that the input/output device 220 is electrically connected to the arithmetic device 210. An information processing device 200 can also include a housing (see FIG. 9B and FIG. 9C).

<<Structure Example 1 of Arithmetic Device 210>>

The arithmetic device 210 is supplied with input information II or sensing information DS. The arithmetic device 210 generates the control information CI and the image information VI on the basis of the input information II or the sensing information DS and supplies the control information CI and the image information VI.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial information, setting information, or an image.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying information and being supplied with information. The input/output interface 215 can be electrically connected to the transmission path 214, for example. The input/output interface 215 can also be electrically connected to the input/output device 220.

The transmission path 214 includes a wiring and has a function of supplying information and being supplied with information. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input information II and the sensing information DS. The input/output device 220 is supplied with the control information CI and the image information VI (see FIG. 9A).

As the input information II, for example, a scan code of a keyboard, positional information, operation information of buttons, sound information, or image information can be used. Alternatively, for example, illuminance information, attitude information, acceleration information, bearing information, pressure information, temperature information, humidity information, or the like of an environment where the information processing device 200 is used, or the like can be used as the sensing information DS.

As the control information CI, for example, a signal controlling the luminance of display of the image information VI, a signal controlling color saturation, or a signal controlling hue can be used. Alternatively, a signal that changes display of part of the image information VI can be used as the control information CI.

The input/output device 220 includes the display portion 230, the input portion 240, and a sensing portion 250. For example, the input/output device described in Embodiment 4 can be used as the input/output device 220. The input/output device 220 can include a communication portion 290.

<<Structure Example of Display Portion 230>>

The display portion 230 displays the image information VI on the basis of the control information CI.

The display portion 230 includes the control portion 238, the driver circuit GD, the driver circuit SD, and the display panel 700 (see FIG. 7). For example, the display device described in Embodiment 3 can be used for the display portion 230.

<<Structure Example of Input Portion 240>>

The input portion 240 generates the input information II. For example, the input portion 240 has a function of supplying positional information P1.

For example, a human interface or the like can be used for the input portion 240 (see FIG. 9A). Specifically, a keyboard, a mouse, a touch sensor, a microphone, a camera, or the like can be used as the input portion 240.

Moreover, a touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes information on the position, path, or the like of the finger in contact with the touch panel and can determine that a predetermined gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image information by using a gesture of moving the finger in contact with the touch panel along the touch panel.

The user can supply a "dragging instruction" for pulling out and displaying a navigation panel NP at an edge portion of the display region 231, by using a gesture of moving a finger touching the edge portion of the display region 231 (see FIG. 9C). Moreover, the user can supply a "leafing through instruction" for displaying index images IND, some parts of other pages, or thumbnail images TN of other pages in an predetermined order on the navigation panel NP so that the user can flip through these images, by using a gesture of moving the position where a finger presses hard or by using the pressure of pressing the finger. Consequently, the user can turn the pages of an e-book like flipping through the pages of a paper book. Moreover, the user can search a given page with the aid of the thumbnail images TN or the index images IND.

<<Structure Example of Sensing Portion 250>>

The sensing portion 250 generates the sensing information DS. The sensing portion 250 has a function of detecting the illuminance of the environment where the information processing device 200 is used and a function of supplying illuminance information, for example.

The sensing portion 250 has a function of sensing the ambient conditions and supplying the sensing information. Specifically, the sensing portion 250 can supply illuminance information, attitude information, acceleration information, bearing information, pressure information, temperature information, humidity information, or the like.

For example, a photodetector, an attitude detector, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

A communication portion 290 has a function of supplying information to a network and obtaining information from the network.

<<Housing>>

Note that the housing has a function of storing the input/output device 220 or the arithmetic device 210. Alternatively, the housing has a function of supporting the display portion 230 or the arithmetic device 210.

Thus, the control information can be generated on the basis of the input information or the sensing information. Alternatively, the image information can be displayed on the basis of the input information or the sensing information. Alternatively, the information processing device can determine the intensity of light received by the housing of the information processing device and operate under the environment where the information processing device is used. Alternatively, a user of the information processing device can select a display method. As a result, a novel information processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 9A).

The artificial intelligence portion 213 is supplied with the input information II or the sensing information DS, and the artificial intelligence portion 213 infers the control information CI on the basis of the input information II or the sensing information DS. Moreover, the artificial intelligence portion 213 supplies the control information CI.

In this manner, the control information CI for display that can be felt suitable can be generated. Alternatively, display that can be felt suitable is possible. Alternatively, the control information CI for display that can be felt comfortable can be generated. Alternatively, display that can be felt comfortable is possible. As a result, a novel information processing device that is highly convenient or reliable can be provided.

[Natural Language Processing on Input Information II]

Specifically, the artificial intelligence portion 213 can perform natural language processing on the input information II to extract one feature from the whole input information II. For example, the artificial intelligence portion 213 can infer emotion or the like put in the input information II, which can be a feature. The artificial intelligence portion 213 can infer the color, design, font, or the like empirically felt suitable for the feature. The artificial intelligence portion 213 can generate information specifying the color, design, or font of a letter or data specifying the color or design of the background, and the information can be used as the control information CI.

Specifically, the artificial intelligence portion 213 can perform natural language processing on the input information II to extract some words included in the input information II. For example, the artificial intelligence portion 213 can extract expressions including a grammatical error, a factual error, emotion, and the like. The artificial intelligence portion 213 generates the control information CI for display of extracted part in the color, design, font, or the like different from those of another part.

[Image Processing on Input Information II]

Specifically, the artificial intelligence portion 213 can perform image processing on the input information II to extract one feature from the input information II. For example, the artificial intelligence portion 213 can infer the age where an image of the input information II is taken, whether the image is taken indoors or outdoors, whether the image is taken in the daytime or at night, or the like, which can be a feature. The artificial intelligence portion 213 can infer the color tone empirically felt suitable for the feature and generate the control information CI for use of the color tone for display. Specifically, data specifying color (e.g., full color, monochrome, or sepia) used for expression of a gradation can be used as the control data CI.

Specifically, the artificial intelligence portion 213 can perform image processing on the input information II to extract some images included in the input information II. For example, the artificial intelligence portion 213 can generate the control information CI for display of a boundary between extracted part of the image and another part. Specifically, the artificial intelligence portion 213 can generate the control information CI for display of a rectangle surrounding the extracted part of the image.

[Inference Using Sensing Information DS]

Specifically, the artificial intelligence portion 213 can generate an inference RI the sensing information DS. Alternatively, the artificial intelligence portion 213 can generate the control information CI on the basis of the inference RI so that the user of the information processing device 200 can feel comfortable.

Specifically, the artificial intelligence portion 213 can generate the control information CI for adjustment of display brightness on the basis of the ambient illuminance or the like so that the display brightness can be felt comfortable. Alternatively, the artificial intelligence portion 213 can generate the control information CI for adjustment of volume on the basis of the ambient noise or the like so that the volume can be felt comfortable.

As the control information CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control information CI.

<Structure Example 2 of Information Processing Device>

Another structure of the information processing device of one embodiment of the present invention is described with reference to FIG. 10A and FIG. 10B.

<<Program>>

A program of one embodiment of the present invention has the following steps (see FIG. 10A).

[First Step]

In a first step, setting is initialized (see (S1) in FIG. 10A).

For example, predetermined image information which is to be displayed on start-up and information for determining a predetermined mode of displaying the image information and a predetermined display method for displaying the image information are acquired from the memory portion 212. Specifically, one still image information or another moving image information can be used as the predetermined image information. Furthermore, a first mode or a second mode can be used as the predetermined mode.

[Second Step]

In a second step, interrupt processing is allowed (see (S2) in FIG. 10A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image information is displayed by a predetermined mode or a predetermined display method selected in the first step or the interrupt processing (see (S3) in FIG. 10A). Note that the predetermined mode determines a mode of displaying the information, and the predetermined display method determines a method for displaying the image information. For example, the image information VI can be used as information to be displayed.

One method for displaying the image information VI can be associated with the first mode, for example. Alternatively, another method for displaying the image information VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the information processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the information processing device 200 is used for a clock, the display can be refreshed at a frequency of once a second, once a minute, or the like.

Note that when a light-emitting element is used as the display element, for example, the light-emitting element can be made to emit light in a pulsed manner so that image information is displayed. Specifically, an organic EL element can be made to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see (S4) in FIG. 10A).

For example, the termination instruction supplied in the interrupt processing may be used for the determination.

[Fifth Step]

In the fifth step, the program terminates (see (S5) in FIG. 10A).

<<Interrupt Processing>>

The interrupt processing includes a sixth step to an eighth step described below (see FIG. 10B).

[Sixth Step]

In the sixth step, the illuminance of the environment where the information processing device 200 is used is detected using the sensing portion 250, for example (see (S6) in FIG. 10B). Note that color temperature or chromaticity of ambient light may be detected instead of the illuminance of the environment.

[Seventh Step]

In the seventh step, a display method is determined on the basis of the detected illuminance information (see (S7) in FIG. 10B). For example, a display method is determined such that the brightness of display is not too dark or too bright.

Note that in the case where the color temperature of the ambient light or the chromaticity of the ambient light is detected in the sixth step, the color of display may be adjusted.

[Eighth Step]

In the eighth step, the interrupt processing terminates (see (S8) in FIG. 10B).

<Structure Example 3 of Information Processing Device>

Another structure of the information processing device of one embodiment of the present invention is described with reference to FIG. 11.

FIG. 11A is a flow chart showing a program of one embodiment of the present invention. FIG. 11A is a flow chart showing interrupt processing different from the interrupt processing shown in FIG. 10B.

Note that the structure example 3 of the information processing device is different from the interrupt processing described with reference to FIG. 10B in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 11A).

[Sixth Step]

In the sixth step, the program proceeds to the seventh step when a predetermined event has been supplied, whereas the program proceeds to the eighth step when the predetermined event has not been supplied (see (U6) in FIG. 11A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 11A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 11B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 11B and FIG. 11C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G1($m$+1) to a scan line G1(2$m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 11A). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, information sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring information distributed via a push service using the communication portion 290 or the like can be associated with a predetermined event.

Note that positional information sensed by the sensing portion 250 may be used for the determination of the presence or absence of a qualification for acquiring information. Specifically, it may be determined that there is a qualification for acquiring information in the case of presence in a predetermined class room, school, conference room, company, building, or the like or in a predetermined region. Thus, for example, educational materials distributed in a classroom of a school, a university, or the like can be received, so that the information processing device 200 can be used as a schoolbook or the like (see FIG. 9C). Alternatively, materials distributed in a conference room in, for example, a company can be received and used for a conference material.

Note that this embodiment can be combined with any of the other embodiments in this specification as appropriate.

Embodiment 6

In this embodiment, structures of an information processing device of one embodiment of the present invention will be described with reference to FIG. 12 to FIG. 14.

Figure 12A:
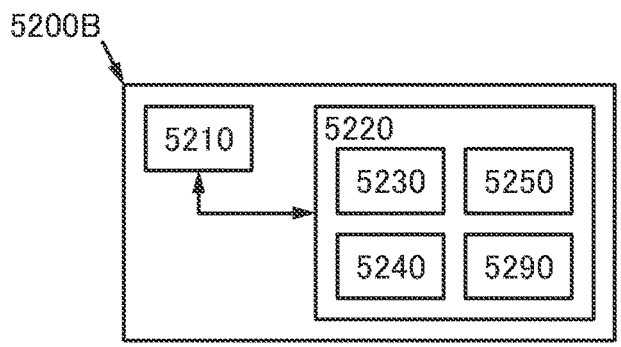
FIG. 12A to FIG. 12E are diagrams illustrating structures of an information processing device of an embodiment.
Figure 12B:
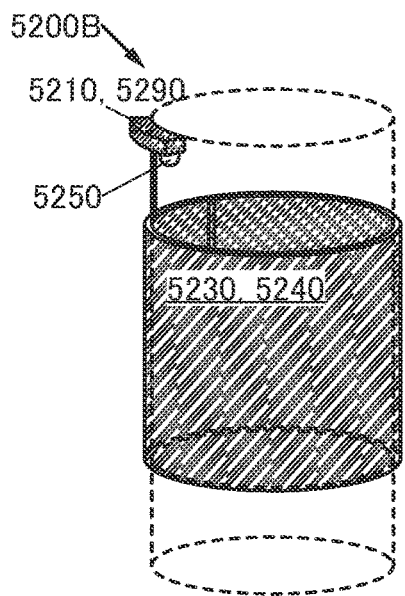
Figure 12C:
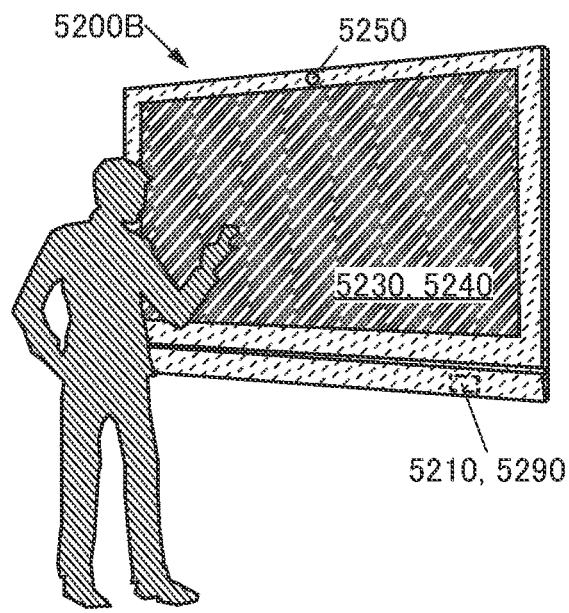
Figure 12D:
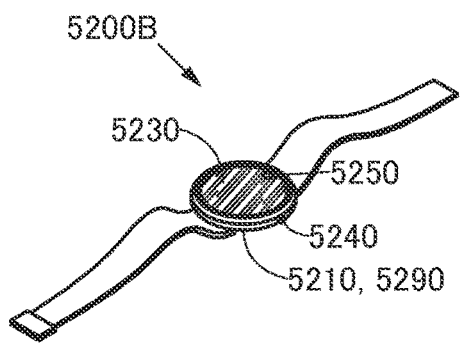
Figure 12E:
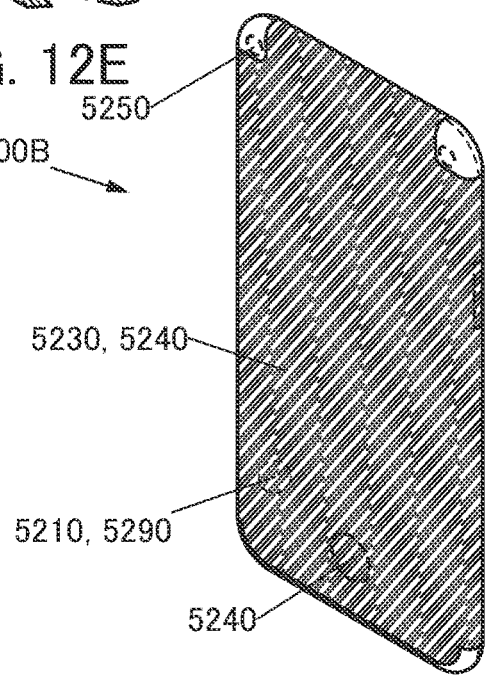
Figure 13A:
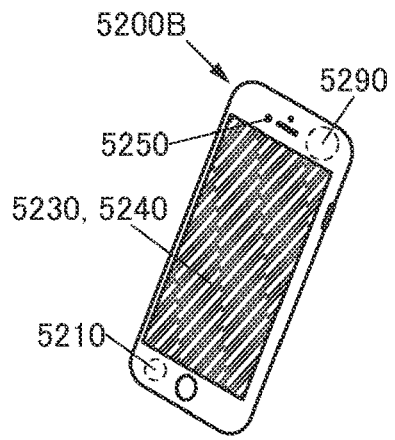
FIG. 13A to FIG. 13E are diagrams illustrating structures of an information processing device of an embodiment.
Figure 13B:
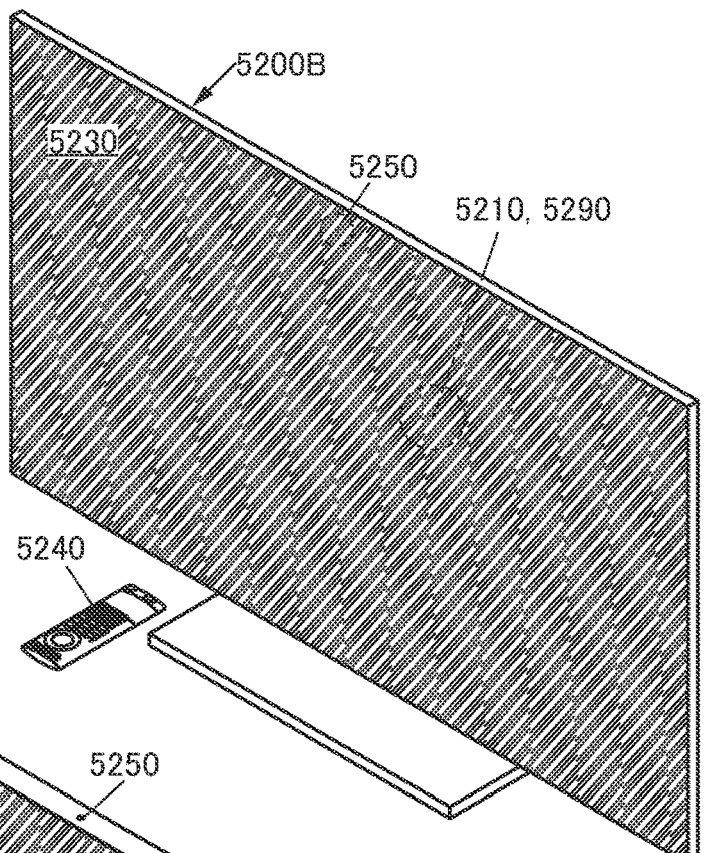
Figure 13C:
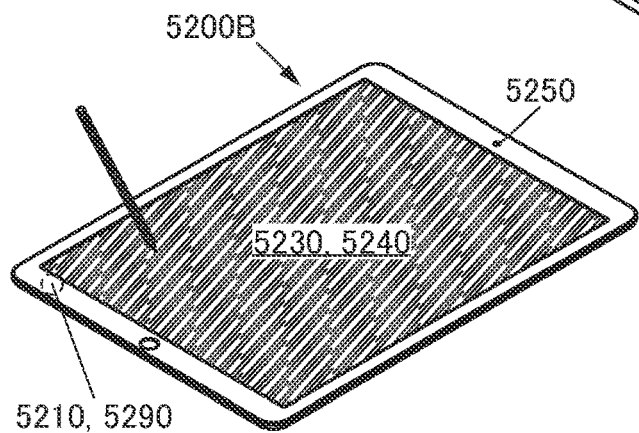
Figure 13D:
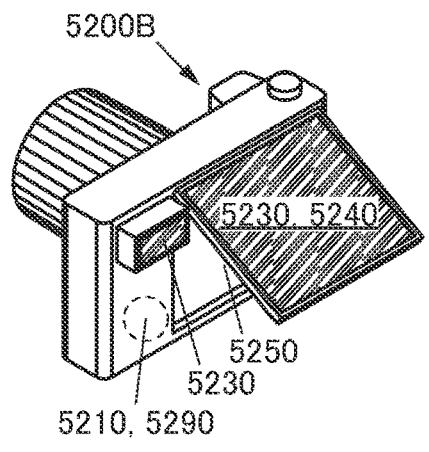
Figure 13E:
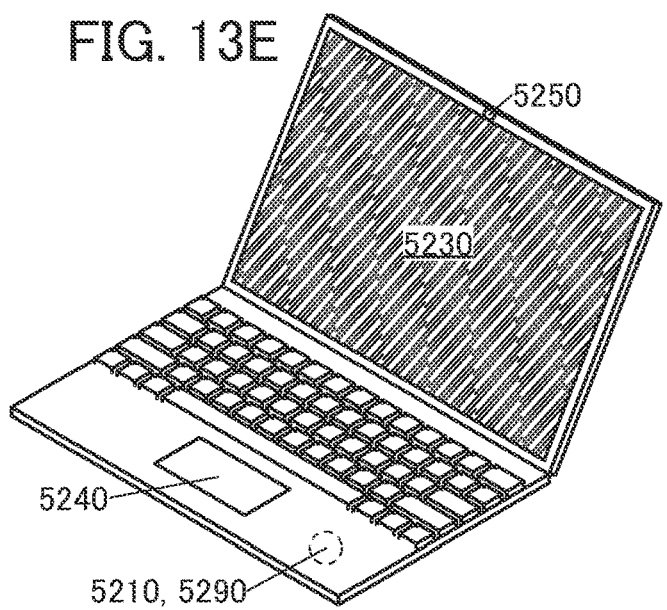
Figure 14A:
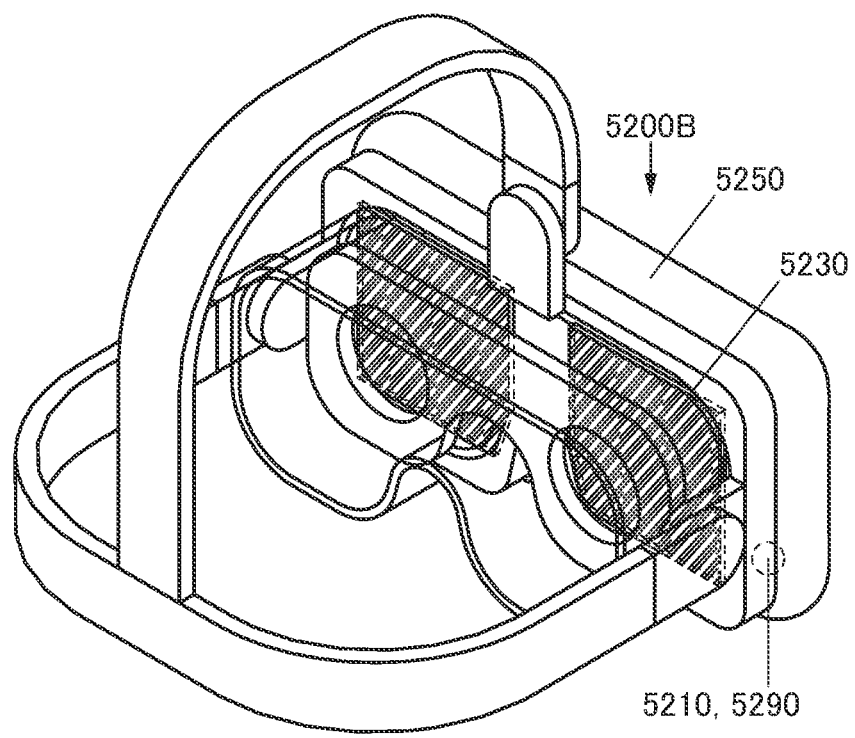
FIG. 14A and FIG. 14B are diagrams illustrating structures of an information processing device of an embodiment.
Figure 14B:
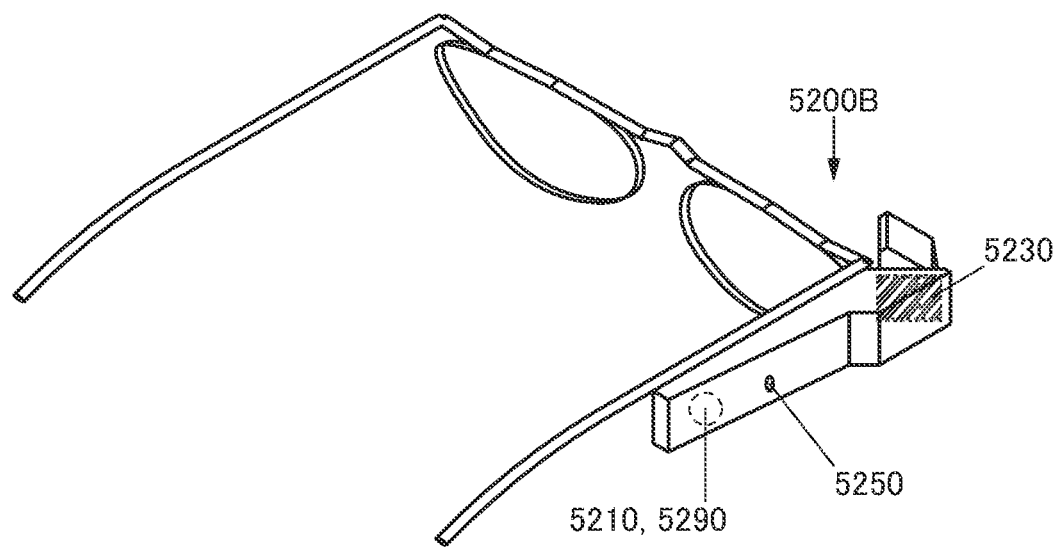

FIG. 12 to FIG. 14 are diagrams illustrating structures of the information processing device of one embodiment of the present invention. FIG. 12A is a block diagram of the information processing device, and FIG. 12B to FIG. 12E are perspective views illustrating structures of the information processing device. FIG. 13A to FIG. 13E are perspective views illustrating structures of the information processing device. FIG. 14A and FIG. 14B are perspective views illustrating structures of the information processing device.

<Information Processing Device>

An information processing device 5200B described in this embodiment includes an arithmetic device 5210 and an input/output device 5220 (see FIG. 12A).

The arithmetic device 5210 has a function of being supplied with operation information and a function of supplying image information on the basis of the operation information.

The input/output device 5220 includes a display portion 5230, an input portion 5240, a sensing portion 5250, and a communication portion 5290 and has a function of supplying operation information and a function of being supplied with image information. The input/output device 5220 also has a function of supplying sensing information, a function of supplying communication information, and a function of being supplied with communication information.

The input portion 5240 has a function of supplying operation information. For example, the input portion 5240 supplies operation information on the basis of operation by a user of the information processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 1 or Embodiment 2 can be used for the display portion 5230.

The sensing portion 5250 has a function of supplying sensing information. For example, the sensing portion 5250 has a function of sensing a surrounding environment where the information processing device is used and supplying sensing information.

Specifically, an illuminance sensor, an imaging device, an attitude detection device, a pressure sensor, a human motion sensor, or the like can be used as the sensing portion 5250.

The communication portion 5290 has a function of being supplied with communication information and a function of supplying communication information. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Information Processing Device>>

For example, the display portion 5230 can have an outer shape along a cylindrical column or the like (see FIG. 12B). In addition, the information processing device has a function of changing its display method in accordance with the illuminance of a usage environment. Furthermore, the information processing device has a function of changing displayed content in response to sensed existence of a person. This allows the information processing device to be provided on a column of a building, for example. The information processing device can display advertising, guidance, or the like. The information processing device can be used for digital signage or the like.

<<Structure Example 2 of Information Processing Device>>

For example, the information processing device has a function of generating image information on the basis of the path of a pointer used by a user (see FIG. 12C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the information processing device can be used for an electronic blackboard, an electronic bulletin board, digital signage, or the like.

<<Structure Example 3 of Information Processing Device>>

The information processing device can receive information from another device, and the information can be displayed on the display portion 5230 (see FIG. 12D). Several options can be displayed. The user can choose some from the options and send a reply to a transmitter of the information. For example, the information processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Information Processing Device>>

For example, the display portion 5230 has a surface gently curved along a side surface of a housing (see FIG. 12E). The display portion 5230 includes a display panel, and the display panel has a function of performing display on the front surface, the side surfaces, the top surface, and the rear surface, for example. Thus, for example, a mobile phone can display information not only on its front surface but also on its side surfaces, its top surface, and its rear surface.

<<Structure Example 5 of Information Processing Device>>

For example, the information processing device can receive information via the Internet and display the information on the display portion 5230 (see FIG. 13A). A created message can be checked on the display portion 5230. The created message can be sent to another device. The information processing device has a function of changing its display method in accordance with the illuminance of a usage environment, for example. Thus, the power consumption of a smartphone can be reduced. Alternatively, for example, a smartphone can display an image so as to be suitably used even in an environment under strong external light, e.g., outdoors in fine weather.

<<Structure Example 6 of Information Processing Device>>

A remote controller can be used as the input portion 5240 (see FIG. 13B). For example, the information processing device can receive information from a broadcast station or via the Internet and display the information on the display portion 5230. An image of a user can be captured using the sensing portion 5250. The image of the user can be transmitted. The information processing device can acquire a viewing history of the user and provide it to a cloud service. The information processing device can acquire recommendation information from a cloud service and display the information on the display portion 5230. A program or a moving image can be displayed on the basis of the recommendation information. For example, the information processing device has a function of changing its display method in accordance with the illuminance of a usage environment. Accordingly, for example, a television system can display an image to be suitably used even when irradiated with strong external light that enters a room in fine weather.

<<Structure Example 7 of Information Processing Device>>

For example, the information processing device can receive educational materials via the Internet and display them on the display portion 5230 (see FIG. 13C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another information processing device. When the information processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Information Processing Device>>

The information processing device includes, for example, a plurality of display portions 5230 (see FIG. 13D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The information processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

<<Structure Example 9 of Information Processing Device>>

For example, the information processing device of this embodiment is used as a master and another information processing device is used as a slave, whereby the other information processing device can be controlled (see FIG. 13E). As another example, part of image data can be displayed on the display portion 5230 and another part of the image data can be displayed on a display portion of another information processing device. Image signals can be supplied. With the communication portion 5290, information to be written can be obtained from an input portion of another information processing device. Thus, a large display region can be utilized by using a portable personal computer, for example.

<<Structure Example 10 of Information Processing Device>>

The information processing device includes, for example, the sensing portion 5250 that senses an acceleration or a direction (see FIG. 14A). The sensing portion 5250 can supply information on the position of the user or the direction in which the user faces. The information processing device can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on a goggles-type information processing device, for example.

<<Structure Example 11 of Information Processing Device>>

The information processing device includes, for example, an imaging device and the sensing portion 5250 that senses an acceleration or a direction (see FIG. 14B). The sensing portion 5250 can supply information on the position of the user or the direction in which the user faces. The information processing device can generate image information in accordance with the position of the user or the direction in which the user faces. Accordingly, the information can be shown together with a real-world scene, for example. An augmented reality image can be displayed on a glasses-type information processing device.

<<Structure Example of Electronic Device to which Display Panel can be Applied>>

Figure 15:
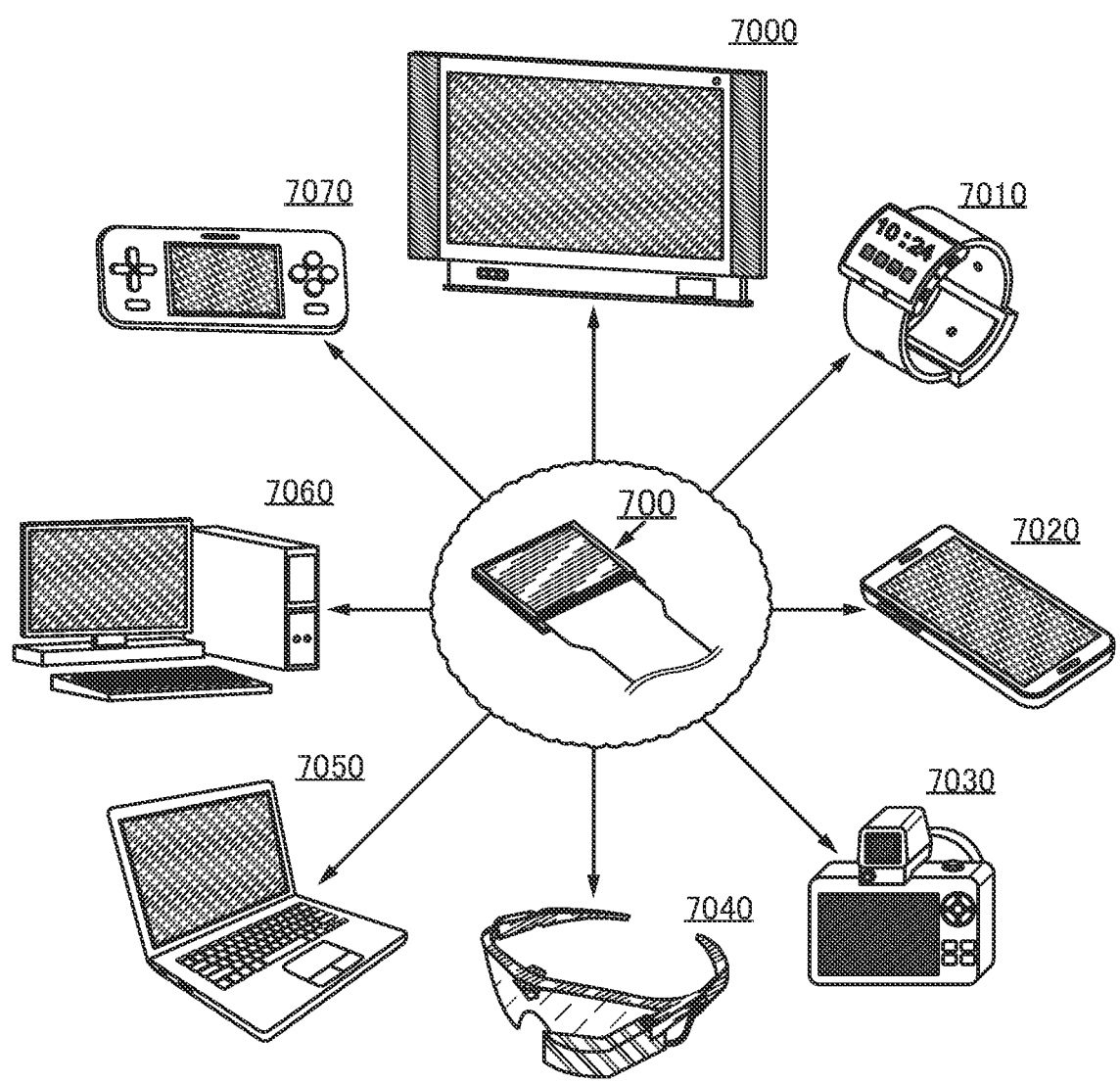
FIG. 15 is a diagrams illustrating electronic devices.

Examples of an electronic device to which the display panel 700 can be applied will be described with reference to FIG. 15.

The display panel 700 can be incorporated into display portions of a TV device 7000 (a television receiver), a smart watch 7010, a smartphone 7020, a digital camera 7030, a glasses-type information terminal 7040, a laptop PC (personal computer) 7050, a PC 7060, a game machine 7070, and the like.

With the use of the display panel 700 in the display portions of the TV device 7000, the smart watch 7010, the smartphone 7020, the digital camera 7030, the glasses-type information terminal 7040, the laptop PC 7050, the PC 7060, the game machine 7070, and the like, high-resolution images can be displayed. Accordingly, a user can view a realistic image.

Note that this embodiment can be combined with any of the other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, BM: light-blocking film, CC: color conversion layer, CI: control information, DS: sensing information, G1: scan line, GCLK: signal, II: input information, IND: index image, NP: navigation panel, P1: positional information, PWC1: signal, PWC2: signal, S1: signal line, SP: control signal, TN: thumbnail image, VI: image information, V11: information, VCOM2: conductive film, 103a: light-emitting unit, 103b: light-emitting unit, 104: intermediate layer, 111: layer, 112: layer, 113: layer, 114: layer, 200: information processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: communication portion, 290: communication portion, 400: molecular weight, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530: pixel circuit, 550: display element, 551: electrode, 552: electrode, 553: layer, 573: insulating film, 573A: insulating film, 573B: insulating film, 574: sealing film, 574A: resin, 574B: film, 591A: opening portion, 700: display panel, 700TP: input/output panel, 702: pixel, 703: pixel, 705: sealant, 770: base material, 770P: functional film, 802: sensor, 5200B: information processing device, 5210: arithmetic device, 5220: input/output device, 5230: display portion, 5240: input portion, 5250: sensing portion, 5290: communication portion, 7000: TV device, 7010: smart watch, 7020: smartphone, 7030: digital camera, 7040: glasses-type information terminal, 7050: PC, 7060: PC, 7070: game machine

The invention claimed is:

1. A display panel comprising:
a display region;
an insulating film; and
a sealing film,
wherein the display region comprises a first pixel,
wherein the first pixel comprises a first display element and a first color conversion layer,
wherein the first color conversion layer comprises a first region overlapping with the first display element,
wherein the first color conversion layer converts first light into second light,
wherein the second light comprises a spectrum including light with a long wavelength in a proportion higher than the first light,
wherein the insulating film covers the first display element,
wherein the sealing film comprises a second region over the insulating film, and the first color conversion layer is sandwiched between the second region and the insulating film,
wherein the sealing film comprises a third region that is on an outside of the display region and in contact with the insulating film,
wherein the first display element emits the first light,
wherein the first display element comprises a first layer, a second layer, a third layer, and a fourth layer,
wherein the third layer is sandwiched between the second layer and the fourth layer,
wherein the second layer is sandwiched between the first layer and the third layer,
wherein the first layer comprises a first material and a second material,
wherein the second layer comprises a third material,
wherein the third layer comprises a light-emitting material and a fourth material,
wherein the fourth layer comprises a fifth material and a sixth material,
wherein the first material has a HOMO level higher than or equal to −5.7 eV and lower than or equal to −5.4 eV,
wherein the second material has an acceptor property,
wherein the third material has a lower HOMO level than the first material,
wherein the fourth material has a lower HOMO level than the third material,
wherein the fifth material has a HOMO level higher than or equal to −6.0 eV, and
wherein the sixth material is an organic complex of alkali metal or an organic complex of alkaline earth metal.

2. The display panel according to claim 1, wherein the fifth material has an electron mobility higher than or equal to $1\times10^{-7}$ cm$^2$/Vs and lower than or equal to $5\times10^{-5}$ cm$^2$/Vs when a square root of an electric field strength [V/cm] is 600.

3. The display panel according to claim 1, wherein the first color conversion layer comprises a quantum dot and a light-transmitting resin.

4. The display panel according to claim 1, wherein the first light is blue light.

5. The display panel according to claim 1,
wherein the first display element comprises a first light-emitting unit, a second light-emitting unit, and an intermediate layer,
wherein the intermediate layer comprises a fourth region sandwiched between the first light-emitting unit and the second light-emitting unit,
wherein the intermediate layer supplies a hole to one of the first light-emitting unit and the second light-emitting unit and supplies an electron to the other of the first light-emitting unit and the second light-emitting unit,
wherein the first light-emitting unit emits blue light, and
wherein the second light-emitting unit emits blue light.

6. The display panel according to claim 1, further comprising a functional layer,
wherein the functional layer comprises a fourth region overlapping with the display element,
wherein the functional layer comprises a first pixel circuit,
wherein the functional layer comprises an opening portion,
wherein the first pixel comprises the first pixel circuit, and
wherein the first pixel circuit is electrically connected to the first display element in the opening portion.

7. The display panel according to claim 1,
wherein the display region comprises a second pixel and a third pixel,
wherein the first pixel displays red,
wherein the second pixel displays green,
wherein the second pixel comprises a second color conversion layer,
wherein the third pixel displays blue,
wherein the first color conversion layer converts blue light into red light, and
wherein the second color conversion layer converts blue light into green light.

8. An information processing device comprising one or more of a keyboard, a hardware button, a pointing device, a touch sensor, an illuminance sensor, an imaging device, an audio input device, an eye-gaze input device, and an attitude detection device, and the display panel according to claim 1.

* * * * *